(12) United States Patent
Yoshida

(10) Patent No.: US 9,379,638 B2
(45) Date of Patent: Jun. 28, 2016

(54) SEMICONDUCTOR DEVICE WHICH GENERATES A DC POWER SUPPLY FROM AN AC POWER SUPPLY

(71) Applicant: Renesas Electronics Corporation, Tokyo (JP)

(72) Inventor: Yoichi Yoshida, Tokyo (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/874,240

(22) Filed: Oct. 2, 2015

(65) Prior Publication Data

US 2016/0028323 A1 Jan. 28, 2016

Related U.S. Application Data

(63) Continuation of application No. 14/534,105, filed on Nov. 5, 2014, now Pat. No. 9,184,671.

(30) Foreign Application Priority Data

Mar. 31, 2014 (JP) .................................. 2014-073671

(51) Int. Cl.
*H01L 27/06* (2006.01)
*H02M 7/02* (2006.01)
(Continued)

(52) U.S. Cl.
CPC ........... *H02M 7/217* (2013.01); *H01L 27/0629* (2013.01); *H02M 7/02* (2013.01); *H02M 7/103* (2013.01); *H02M 2001/0048* (2013.01); *Y10T 307/25* (2015.04)

(58) Field of Classification Search
CPC ......... H02M 7/02–7/40; H02M 7/103; H02M 7/155; H02M 7/217; H02M 7/162; H02M 7/219; H02M 7/521; H02M 7/5387; H02M 2003/071–2003/072; H02M 2003/075–2003/078; H01L 27/0629
See application file for complete search history.

(56) References Cited

U.S. PATENT DOCUMENTS 5,173,849 A * 12/1992 Brooks .............. G06K 19/0701
327/104
5,289,537 A * 2/1994 Yamamoto .......... H04M 1/6033
379/377

(Continued)

FOREIGN PATENT DOCUMENTS

JP 2008-11584 A 1/2008

OTHER PUBLICATIONS

U.S. Notice of Allowance dated Jul. 2, 2015 in U.S. Appl. No. 14/534,105.

*Primary Examiner* — Laura Menz
*Assistant Examiner* — Maliheh Malek
(74) *Attorney, Agent, or Firm* — McGinn IP Law Group, PLLC

(57) ABSTRACT

A semiconductor device comprising a rectifier circuit, wherein the rectifier circuit includes first and second input wires to which AC signals whose phases are inverted from each other are transmitted; a first transistor of a first conductive type which has a first power wire connected with a first transistor terminal and a gate connected with the first input wire; a second transistor of the first conductive type which has the first power wire connected with a first transistor terminal, and a gate connected with the second input wire; a third transistor of a second conductive type which has a second power wire connected with a first transistor terminal, a second transistor terminal connected with a second transistor terminal of the first transistor and a gate connected with the first input capacitor; and a fourth transistor of the second conductive type which has the second power wire connected with a first transistor terminal.

15 Claims, 18 Drawing Sheets

(51) Int. Cl.
*H02M 7/217* (2006.01)
*H02M 7/10* (2006.01)
*H02M 1/00* (2006.01)

(56) References Cited

U.S. PATENT DOCUMENTS

| | | | | |
|---|---|---|---|---|
| 5,493,486 | A * | 2/1996 | Connell | H02M 3/07 307/110 |
| 5,825,214 | A * | 10/1998 | Klosa | G05F 1/575 327/104 |
| 5,982,223 | A * | 11/1999 | Park | H02M 3/073 327/536 |
| 6,078,512 | A * | 6/2000 | Bouvier | H02M 7/219 363/127 |
| 6,208,196 | B1 * | 3/2001 | St. Pierre | H02M 3/07 327/536 |
| 6,239,651 | B1 * | 5/2001 | Fournel | G11C 5/145 327/536 |
| 6,252,452 | B1 * | 6/2001 | Hatori | H03K 3/0315 327/544 |
| 6,433,619 | B2 * | 8/2002 | Akita | 307/110 |
| 6,727,757 | B1 * | 4/2004 | Venkatraman | H03F 3/45183 330/253 |
| 6,967,523 | B2 * | 11/2005 | DeMone | G04G 19/04 307/110 |
| 7,424,265 | B2 * | 9/2008 | Umeda | G06K 19/0723 340/10.4 |
| 7,436,241 | B2 * | 10/2008 | Chen | H02M 3/073 327/536 |
| 7,561,866 | B2 * | 7/2009 | Oliver | G06K 19/0723 327/535 |
| 7,564,297 | B2 * | 7/2009 | Nonaka | H02M 3/07 327/333 |
| 7,596,003 | B2 * | 9/2009 | Nishikawa | H02M 3/3387 363/21.04 |
| 7,929,332 | B2 * | 4/2011 | Fujita | G06F 12/0891 365/154 |
| 7,944,279 | B1 * | 5/2011 | El Waffaoui | G06K 19/0713 327/536 |
| 8,248,742 | B2 * | 8/2012 | Okushima | H01L 27/0262 361/111 |
| 8,301,915 | B2 * | 10/2012 | Watanabe | G06K 19/0701 713/300 |
| 8,395,505 | B2 * | 3/2013 | Hadley | G06K 7/0008 340/10.1 |
| 8,415,837 | B2 * | 4/2013 | Theilmann | H02J 5/005 307/149 |
| 8,665,255 | B2 * | 3/2014 | Tsujino | H02M 3/073 323/220 |
| 8,792,260 | B2 * | 7/2014 | Fujita | H02M 7/217 363/127 |
| 2003/0021158 | A1 * | 1/2003 | Gomez | G06K 19/0723 365/233.1 |
| 2004/0212421 | A1 * | 10/2004 | Naka | G05F 3/242 327/541 |
| 2005/0205679 | A1 * | 9/2005 | Alihodzic | G06K 19/0701 235/492 |
| 2005/0282505 | A1 * | 12/2005 | Umeda | G06K 19/0723 455/100 |
| 2006/0128345 | A1 * | 6/2006 | Ootaka | G06K 19/0701 455/333 |
| 2007/0178857 | A1 * | 8/2007 | Greene | H02J 1/10 455/127.1 |
| 2008/0078923 | A1 * | 4/2008 | Hirose | G01J 1/44 250/214.1 |
| 2008/0080214 | A1 * | 4/2008 | Umeda | H02J 17/00 363/37 |
| 2009/0010034 | A1 * | 1/2009 | Yamase | H02M 7/103 363/127 |
| 2009/0225576 | A1 * | 9/2009 | Zierhofer | H02M 7/219 363/127 |
| 2009/0268497 | A1 * | 10/2009 | Liu | H02M 7/219 363/127 |
| 2010/0165686 | A1 * | 7/2010 | Matzberger | H02M 7/219 363/127 |
| 2011/0025654 | A1 * | 2/2011 | Nishimura | H03F 3/3022 345/204 |
| 2011/0298545 | A1 * | 12/2011 | Morimoto | H03F 1/0216 330/296 |
| 2012/0049937 | A1 * | 3/2012 | El Waffaoui | H02M 7/217 327/536 |
| 2012/0075897 | A1 * | 3/2012 | Fujita | H02M 7/217 363/127 |
| 2012/0133419 | A1 * | 5/2012 | Frey | H02M 7/217 327/427 |
| 2012/0274392 | A1 * | 11/2012 | Webb | H02M 3/073 327/536 |
| 2013/0069709 | A1 * | 3/2013 | Franzon | H02M 7/217 327/531 |
| 2013/0155742 | A1 * | 6/2013 | Lee | H02M 7/103 363/126 |
| 2013/0297889 | A1 * | 11/2013 | Fujita | G06F 12/0808 711/144 |
| 2014/0184299 | A1 * | 7/2014 | Chung | H03L 5/00 327/333 |
| 2014/0254224 | A1 * | 9/2014 | Feldtkeller | H02M 7/5387 363/127 |
| 2014/0306768 | A1 * | 10/2014 | Wang | H03F 3/16 330/297 |
| 2014/0368286 | A1 * | 12/2014 | Sun | H03B 5/24 331/117 R |
| 2015/0043260 | A1 * | 2/2015 | Liu | H01L 27/0629 363/127 |
| 2015/0054550 | A1 * | 2/2015 | Koyama | H03F 1/0261 327/109 |
| 2015/0244326 | A1 * | 8/2015 | Jeong | H03F 1/0266 330/296 |
| 2015/0295492 | A1 * | 10/2015 | Li | H02M 3/07 327/536 |

* cited by examiner

SEMICONDUCTOR DEVICE WHICH GENERATES A DC POWER SUPPLY FROM AN AC POWER SUPPLY

CROSS-REFERENCE TO RELATED APPLICATIONS

This application is a Continuation Application of U.S. patent application Ser. No. 14/534,105, filed on Nov. 5, 2014, which is based upon and claims the benefit of priority from Japanese patent application No. 2014-073671, filed on Mar. 31, 2014, the disclosure of which is incorporated herein in its entirety by reference.

BACKGROUND

The present invention relates to a semiconductor device and relates to, for example, a semiconductor device which generates a DC power supply from an AC power supply by using an environmental radio wave as the AC power supply.

In recent years, a demand for improvement of energy use efficiency is increasing. One of methods of improving energy use efficiency is an energy recovering method of receiving an environmental radio wave at an antenna and operating a charge pump rectifier circuit by the received environmental radio wave. In this regard, Japanese Unexamined Patent Application Publication No. 2008-11584 discloses an example of an energy recovering technique which uses a charge pump rectifier circuit.

Japanese Unexamined Patent Application Publication No. 2008-11584 discloses a technique of, in the charge pump rectifier circuit, establishing AC connection between a gate electrode of a diode-connected MOS transistor and an AC signal node whose phase is inverted from that of an AC signal to be applied to a source electrode or a drain electrode of the rectifier circuit. Further, this charge pump rectifier circuit superimposes a DC bias voltage on the AC signal, and applies the voltage to the gate electrode. By this means, this charge pump rectifier circuit reduces an on voltage and an on resistance upon a forward operation of a diode circuit and reduces a reverse leakage current to perform highly efficient AC/DC power conversion.

SUMMARY

However, the technique disclosed in Japanese Unexamined Patent Application Publication No. 2008-11584 has the following problem that a leakage current cannot be sufficiently reduced, and AC signal conversion efficiency lowers. The other problems and new features will be apparent from the disclosure of the present description and the accompanying drawings.

According to one embodiment, a semiconductor device includes first and second transistor columns which each include a NMOS transistor and a PMOS transistor which are connected in series between a first power wire and a second power wire. Further, a gate of the PMOS transistor of one transistor column is connected to a wire which connects the NMOS transistor and the PMOS transistor of the other transistor column. Furthermore, an AC signal obtained by superimposing a signal on a bias voltage which is a voltage lower than that of the gate of the PMOS transistor included in the same transistor column is supplied to the gate of the NMOS transistor included in the transistor column.

According to the above one embodiment, it is possible to reduce a leakage current, and improve AC signal conversion efficiency.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

First Embodiment

Embodiments will be described below with reference to the accompanying drawings. First, a semiconductor device 1 according to the first embodiment has a charge pump rectifier circuit (referred to simply as a rectifier circuit below). Further, the semiconductor device 1 according to the first embodiment receives as an input signal an AC signal based on an environmental radio wave at an antenna provided outside. Furthermore, the semiconductor device 1 supplies to a load circuit a power voltage VDD based-on which this AC signal is generated. The load circuit does not require that the load circuit is formed on the same semiconductor chip as the rectifier circuit.

Further, hereinafter, a first conductive type and a second conductive type will be referred to as an N type and a P type as transistor conductive types. However, when one of the types of the N type and the P type is the first conductive type and the other conductive type is the second conductive type, the first conductive type can be the P type and the second conductive type can be the N type.

Further, hereinafter, one of a source and a drain of a transistor will be referred to as a first transistor terminal, and the other one of the source and the drain will be referred to as a second transistor terminal below. Hereinafter, a terminal which is one of a source and a drain of a PMOS transistor and which is connected to a second power wire Lp2 side wire will be referred to as a first transistor terminal, and a terminal which is connected to a first power wire Lp1 side wire will be described as a second transistor terminal. Further, a terminal which is one of a source and a drain of a NMOS transistor and which is connected to a first power wire Lp1 side wire will be referred to as the first transistor terminal, and a terminal which is connected to a second power wire Lp2 side wire will be described as a second transistor terminal.

Figure 1:
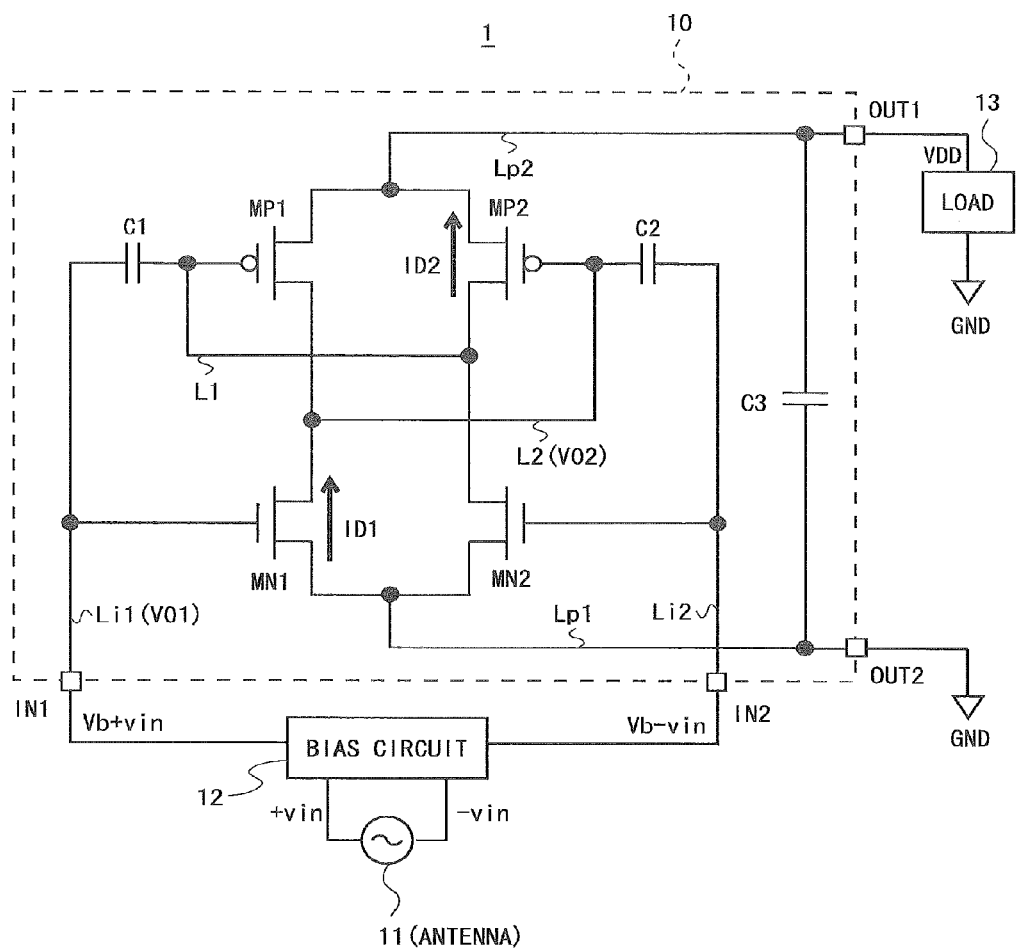
FIG. 1 is a block diagram of a semiconductor device according to a first embodiment.

FIG. 1 is a block diagram of the semiconductor device 1 according to the first embodiment. As illustrated in FIG. 1, the semiconductor device 1 according to the first embodiment has a rectifier circuit 10, a bias circuit 12 and a load 13. Further, FIG. 1 illustrates an AC signal source 11. This AC signal source 11 is, for example, an antenna, and receives an environmental radio wave and generates a differential AC signal. Further, the bias circuit 12 does not require that the bias circuit 12 is provided on the same semiconductor chip as the rectifier circuit 10.

The bias circuit 12 generates a bias voltage Vb, superimposes an AC signal outputted from the AC signal source 11, on the bias voltage Vb and outputs the voltage. The load 13 is a circuit such as a functional circuit which performs actual computation processing, and uses as an operating power supply the power voltage VDD outputted from the rectifier circuit 10.

The rectifier circuit 10 includes a first transistor (e.g. a NMOS transistor MN1), a second transistor (e.g. a NMOS transistor MN2), a third transistor (e.g. a PMOS transistor MP1), a fourth transistor (e.g. a PMOS transistor MP2), a first capacitor C1, a second capacitor C2 and a third capacitor C3. Further, the rectifier circuit 10 includes a first power wire Lp1, a second power wire Lp2, a first input wire Li1, a second input wire Li2, a first inter-element wire L1 and a second inter-element wire L2.

FIG. 1 illustrates a first input terminal IN1, a second input terminal IN2, a first output terminal OUT1 and a second output terminal OUT2 as terminals of the rectifier circuit 10. These terminals are illustrated for description of the rectifier circuit 10, and are not necessarily provided when the rectifier circuit 10 and other circuit blocks are formed on a semiconductor chip. The first input terminal IN1 is provided on the first input wire Li1, the second input terminal IN2 is provided on the second input wire Li2, the first output terminal OUT1 is provided on the second power wire Lp2 and the second output terminal OUT2 is provided on the first power wire Lp1.

AC signals whose phases are inverted from each other are transmitted to the first input wire Li1 and the second input wire Li2. In an example illustrated in FIG. 1, the AC signal superimposed on the bias voltage Vb by the bias circuit 12 (e.g. a signal whose voltage value takes Vb+vin or Vb−vin) is transmitted to the first input wire Li1 and the second input wire Li2.

The NMOS transistor MN1 has a first power wire (e.g. a ground wire to which a ground voltage GND is supplied) connected with the first transistor terminal, and a gate connected with the first input wire Li1. The NMOS transistor MN2 has the first power wire Lp1 connected with the first transistor terminal, and the gate connected with the second input wire Li2.

The first capacitor C1 has one end connected to the first input wire Li1. The second capacitor C2 has one end connected to the second input wire Li2.

The PMOS transistor MP1 has the second power wire Lp2 (e.g. a power wire which generates the power voltage VDD) connected with the first transistor terminal, and a gate connected with the other end of the first capacitor C1. The PMOS transistor MP2 has the second power wire Lp2 connected with the first transistor terminal, and a gate connected with the other terminal of the second capacitor C2.

Further, in the rectifier circuit 10, the first inter-element wire L1 connects the second transistor terminal of the NMOS transistor MN2, the second transistor terminal of the PMOS transistor MP2 and the gate of the PMOS transistor MP1. Furthermore, the second inter-element wire L2 connects the second transistor terminal of the NMOS transistor MN1, the second transistor terminal of the PMOS transistor MP1 and the gate of the PMOS transistor MP2. Still further, in the rectifier circuit 10, the third capacitor C3 is connected between the first power wire Lp1 and the second power wire Lp2.

Figure 2:
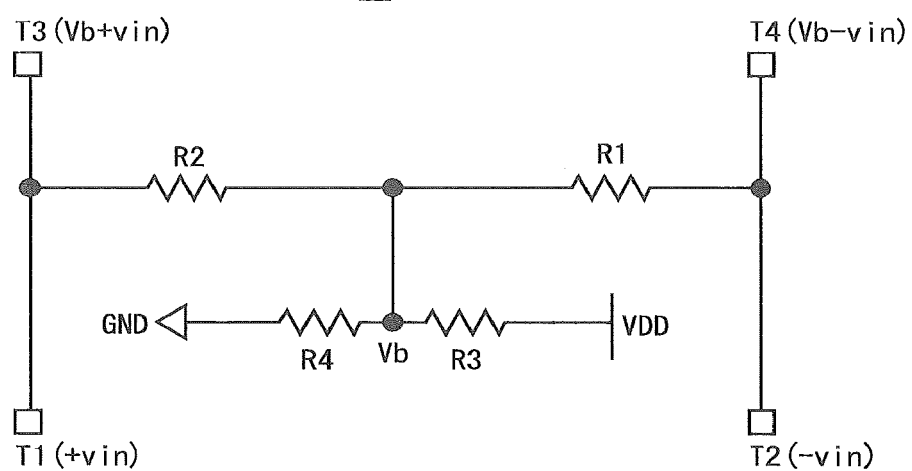
FIG. 2 is a circuit diagram of a bias circuit according to the first embodiment.

Hereinafter, an example of a circuit configuration of the bias circuit 12 will be described. Next, FIG. 2 illustrates a circuit diagram illustrating an example of the bias circuit 12. As illustrated in FIG. 2, the bias circuit 12 includes resistors R1 to R4. Further, FIG. 2 illustrates a first terminal T1 to a fourth terminal T4 as terminals of the bias circuit 12.

The resistors R3 and R4 are connected in series between a power wire to which the power voltage VDD is supplied and a ground wire to which the ground voltage GND is supplied. Further, the bias voltage Vb including a voltage value obtained by dividing the power voltage VDD by a resistance ratio of the resistors R3 and R4 is generated at a connection point between the resistors R3 and R4.

The resistors R1 and R2 are connected in series between a wire which connects the first terminal T1 and the third terminal T3 and a wire which connects the second terminal T2 and the fourth terminal T4. Further, a connection point at which the resistors R1 and R2 are connected and a connection point at which the resistors R3 and R4 are connected are connected with each other. By this means, the bias voltage Vb is supplied to the connection point at which the resistors R1 and R2 are connected, and an AC signal vin is superimposed on this bias voltage Vb.

Figure 3:
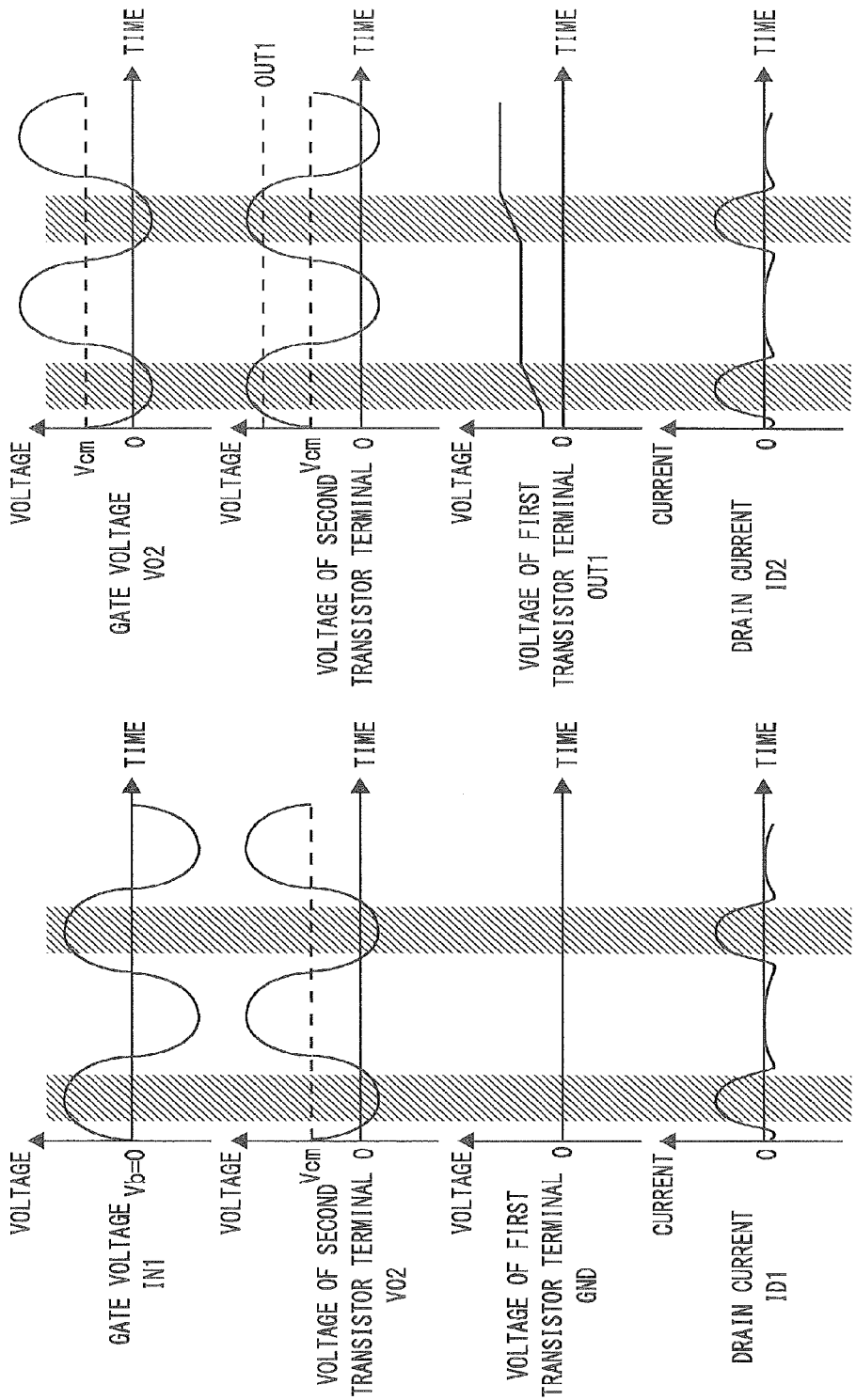
FIG. 3 is a timing chart illustrating operations of the semiconductor device according to the first embodiment.

Subsequently, an operation of the semiconductor device 1 according to the first embodiment will be described. Next, FIG. 3 illustrates a timing chart illustrating the operations of the semiconductor device 1 according to the first embodiment. In the semiconductor device 1, the NMOS transistor MN1 and the PMOS transistor MP1 function as first charge pump circuits, and the NMOS transistor MN2 and the PMOS transistor MP2 function as second charge pump circuits. Further, in the semiconductor device 1, the first charge pump circuits and the second charge pump circuits perform operations in a complementary manner. Hence, FIG. 3 illustrates only operations of the NMOS transistor MN1 and the PMOS transistor MP2 among operations of the semiconductor device 1. Further, FIG. 3 illustrates an example where the bias voltage vb is 0 V.

As illustrated in FIG. 3, in the semiconductor device 1, AC signals whose phases are inverted from each other are inputted to the NMOS transistor MN1 and the PMOS transistor MP2. Further, a signal whose center of the amplitude is a common voltage Vcm is inputted to the gate of the PMOS transistor MP2. Meanwhile, the AC signal inputted to the gate of the NMOS transistor MN1 is a signal whose center of the amplitude is the bias voltage Vb including a voltage value lower than the common voltage Vcm. FIG. 3 illustrates an example where the bias voltage Vb is 0 V.

Further, the voltage of the second transistor terminal of the NMOS transistor MN1 has the common voltage Vcm as the center of the amplitude, and has a waveform whose phase is inverted from the phase of the AC signal inputted to the gate. Furthermore, the voltage of the first transistor terminal of the NMOS transistor MN1 is connected to the ground wire, and maintains the ground voltage (e.g. 0 V).

Meanwhile, the voltage of the second transistor terminal of the PMOS transistor MP2 has the common voltage Vcm as the center of the amplitude, and has a waveform whose phase is inverted from the phase of the AC signal inputted to the gate. Further, the voltage of the first transistor terminal of the PMOS transistor MP2 has a waveform which rises to a fixed voltage value according to a signal cycle.

More specifically, the operations of the semiconductor device 1 are as follows. When a voltage equal to or more than a threshold of the NMOS transistor MN1 is supplied between the second transistor terminal and the gate of the NMOS transistor MN1, the NMOS transistor MN1 enters the on state. Further, a drain current ID1 flows to the second transistor terminal from the first transistor terminal of the NMOS transistor MN1. In a period in which a voltage equal to or more than a threshold voltage of the NMOS transistor MN1 is supplied to the gate of the NMOS transistor MN1, an AC signal of a low voltage level (a signal which is supplied to the gate of the NMOS transistor MN1 and whose voltage is inverted) is supplied to one end of the second capacitor C2. Hence, the second capacitor C2 is charged by this drain current ID1.

Meanwhile, in a period in which a voltage equal to or more than the threshold voltage of the NMOS transistor MN1 is supplied to the gate of the NMOS transistor MN1, a voltage equal to or more than the threshold voltage of the PMOS transistor MP2 is supplied between the first transistor terminal and a control terminal of the PMOS transistor MP2. Hence, the PMOS transistor MP2 enters an on state, and a drain current ID2 flows therein. In this case, an AC signal of a high voltage level (a signal supplied to the gate of the NMOS transistor MN1) is supplied to one end of the first capacitor C1. Hence, electrical charges which are charged in the first capacitor C1 in a previous AC signal cycle are charged in the third capacitor C3 through the PMOS transistor MP2. A charging current to this third capacitor C3 is the drain current ID2.

According to the above operation, in the semiconductor device 1, the second capacitor C2 is charged by the drain current ID1 and the third capacitor C3 is charged by the drain current ID2 in hatched periods in FIG. 3. In addition, in the hatched periods in FIG. 3, the first capacitor C1 is charged by a drain current ID3 (not illustrated in FIG. 1) flowing to the NMOS transistor MN2, and the third capacitor C3 is charged by a drain current ID4 (not illustrated in FIG. 1) flowing to the PMOS transistor MP1.

The semiconductor device 1 according to the first embodiment can reduce a leakage current which is generated near a point of time at which the polarity of the AC signal is switched upon performing the above operation. This leakage current is generated in a period in which an AC signal is inputted to the semiconductor device 1, and will be referred to as a dynamic leakage current below. Next, a dynamic leakage current will be described below.

Figure 4:
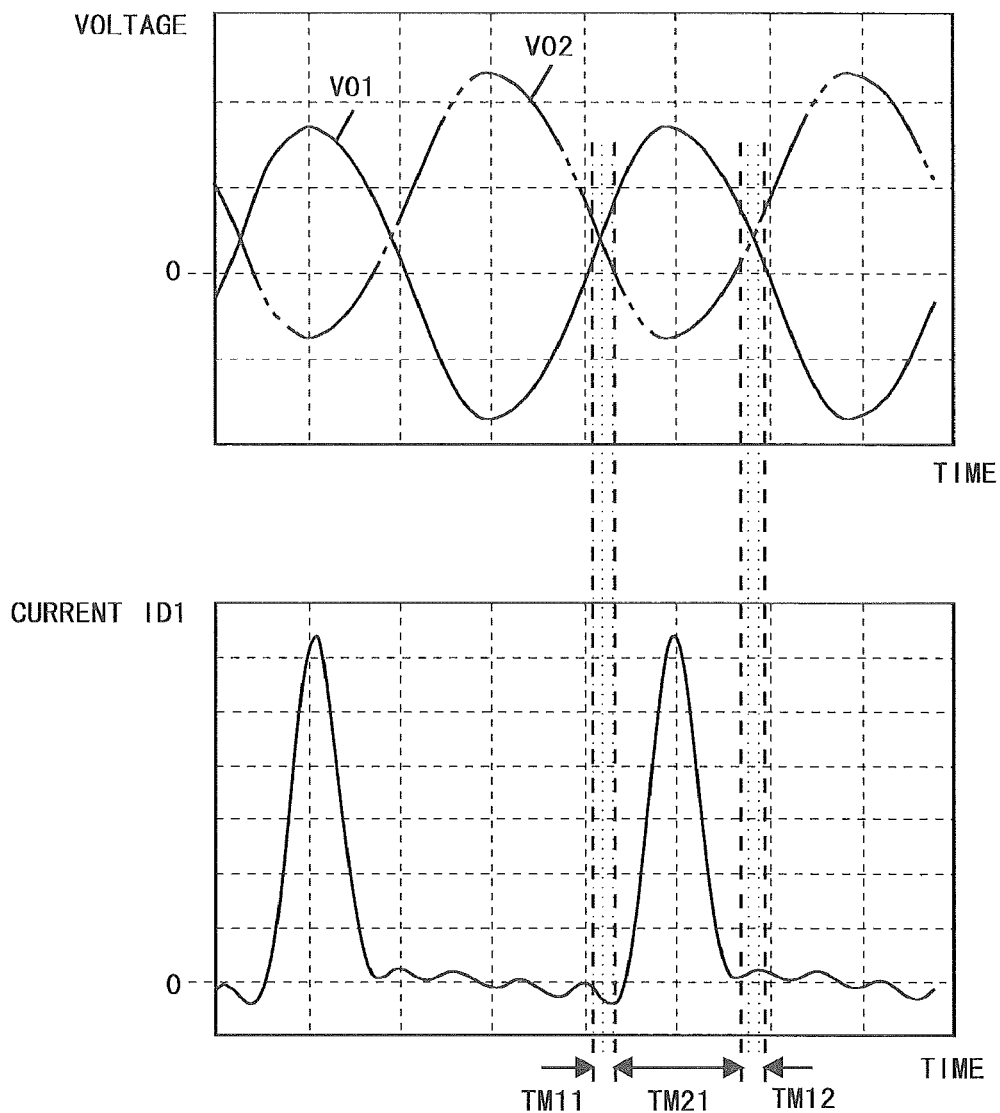
FIG. 4 is a timing chart illustrating a change in a current upon an operation of the semiconductor device according to the first embodiment.

FIG. 4 is a timing chart illustrating a change in a current upon an operation of the semiconductor device according to the first embodiment. This timing chart is a result obtained by simulation. FIG. 4 illustrates an AC signal V01 inputted to the gate of the NMOS transistor MN1 and a voltage V02 of the second transistor terminal of the NMOS transistor MN1 (alternatively, an AC signal inputted to the gate of the PMOS transistor MP2) in the upper timing chart. The lower timing chart in FIG. 4 is a timing chart illustrating a change in the drain current ID1.

As illustrated in FIG. 4, in the semiconductor device 1 according to the first embodiment, the drain current ID1 flows in a period in which the AC signal V01 inputted to the gate of the MOS transistor MN1 is applied to the gate of the MOS transistor MN1 and the voltage between the second transistor terminal and the gate of the MOS transistor MN1 is the threshold voltage of the NMOS transistor MN1 or more. However, in the NMOS transistor MN1, a direction in which the drain current ID1 flows changes depending on a voltage relationship between the first transistor terminal and the second transistor terminal. More specifically, when the voltage between the second transistor terminal and the gate of the NMOS transistor MN1 is larger than the threshold voltage of the NMOS transistor MN1 and when the voltage of the first transistor terminal is higher than the voltage of the second transistor terminal, the drain current ID1 flows from the second transistor terminal to the first transistor terminal (an arrow direction in FIG. 1). Meanwhile, when the voltage between the first transistor terminal and the gate of the NMOS transistor MN1 is larger than the threshold voltage of the NMOS transistor MN1 and when the voltage of the second transistor terminal is higher than the voltage of the first transistor terminal, the drain current ID1 flows from the second transistor terminal to the first transistor terminal (a reverse direction of the arrow direction in FIG. 1).

In view of the above, in periods TM11 and TM12 near a start point and an end point of periods in which the AC signal V01 has a voltage equal to or more than the threshold voltage of the NMOS transistor MN1, the voltage V02 of the second transistor terminal of the NMOS transistor MN1 is higher than the voltage (0 V in FIG. 4) of the first transistor terminal of the NMOS transistor MN1 and the drain current ID1 flows in the reverse direction (a direction from the second transistor terminal to the first transistor terminal). Hence, a period in which the second capacitor C2 is charged by the drain current ID1 in the semiconductor device 1 according to the first embodiment is a period TM21 in which the voltage V02 of the second transistor terminal is 0 V or less in the period in which the AC signal V01 has a voltage equal to or more than the threshold voltage of the NMOS transistor MN1. In addition, in these periods TM11 and TM12, the NMOS transistor MN1 enters a conducted state, a current flowing in the reverse direction from the second inter-element wire L2 to the first power wire Lp1 is generated and part of electrical charges accumulated in the second capacitor C2 is lost as a leakage current.

However, in the semiconductor device 1 according to the first embodiment, durations of these periods T11 and TM12 which occupy in one cycle of an AC signal are very short compared to the comparative example described below. Hence, the semiconductor device 1 according to the first embodiment can make an amount of generated leakage current with respect to a sum of charging currents in one cycle of an AC signal very small compared to the comparative example described below. Next, an operation when a bias voltage of an AC signal supplied to the gate of the NMOS transistor MN1 and a bias voltage of an AC signal supplied to the gate of the PMOS transistor MP2 are both the common voltage Vcm will be described as the comparative example.

Figure 5:
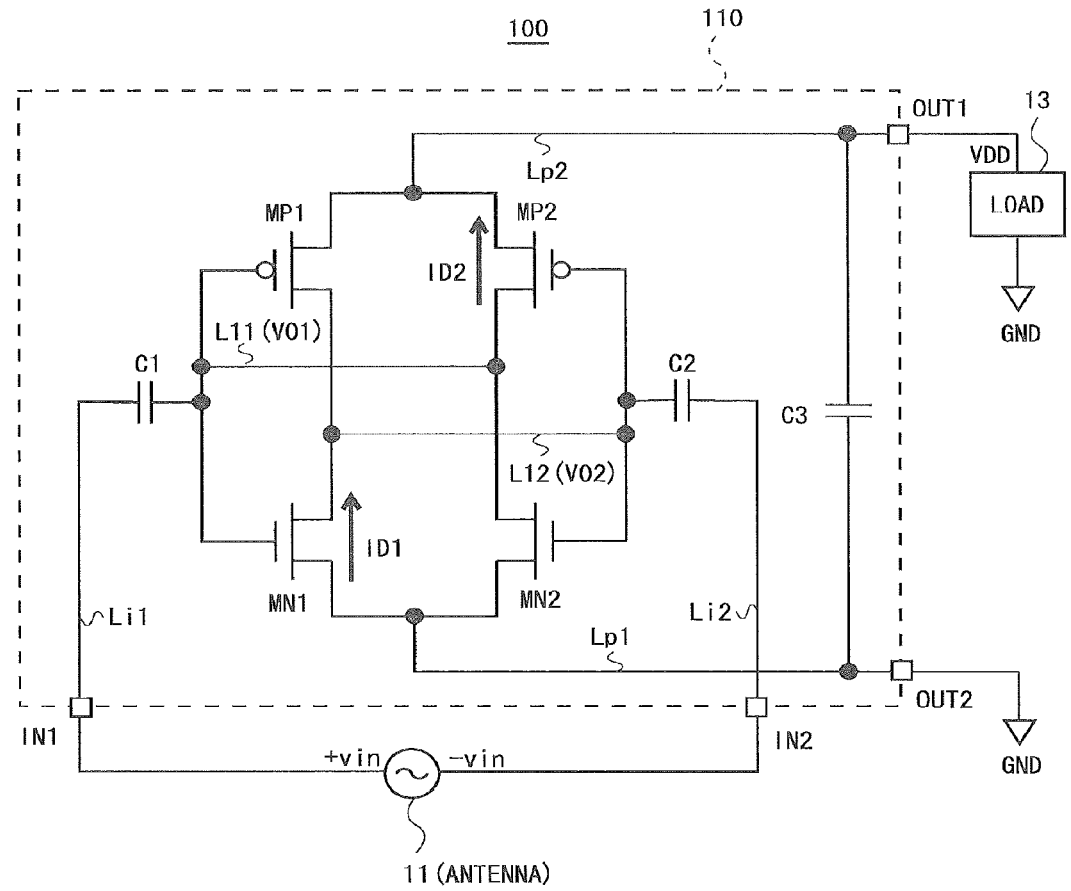
FIG. 5 is a block diagram of a semiconductor device according to a comparative example.

Next, FIG. 5 illustrates a circuit diagram of a semiconductor device 100 according to the comparative example. As illustrated in FIG. 5, in the semiconductor device 100, the gate of the NMOS transistor MN1 and the gate of the PMOS transistor MP1 are commonly connected, and AC signals are supplied to these transistors through the first capacitor C1. Further, the gate of the NMOS transistor MN2 and the gate of the PMOS transistor MP2 are also commonly connected, and AC signals are supplied to these transistors through the second capacitor C2.

Figure 6:
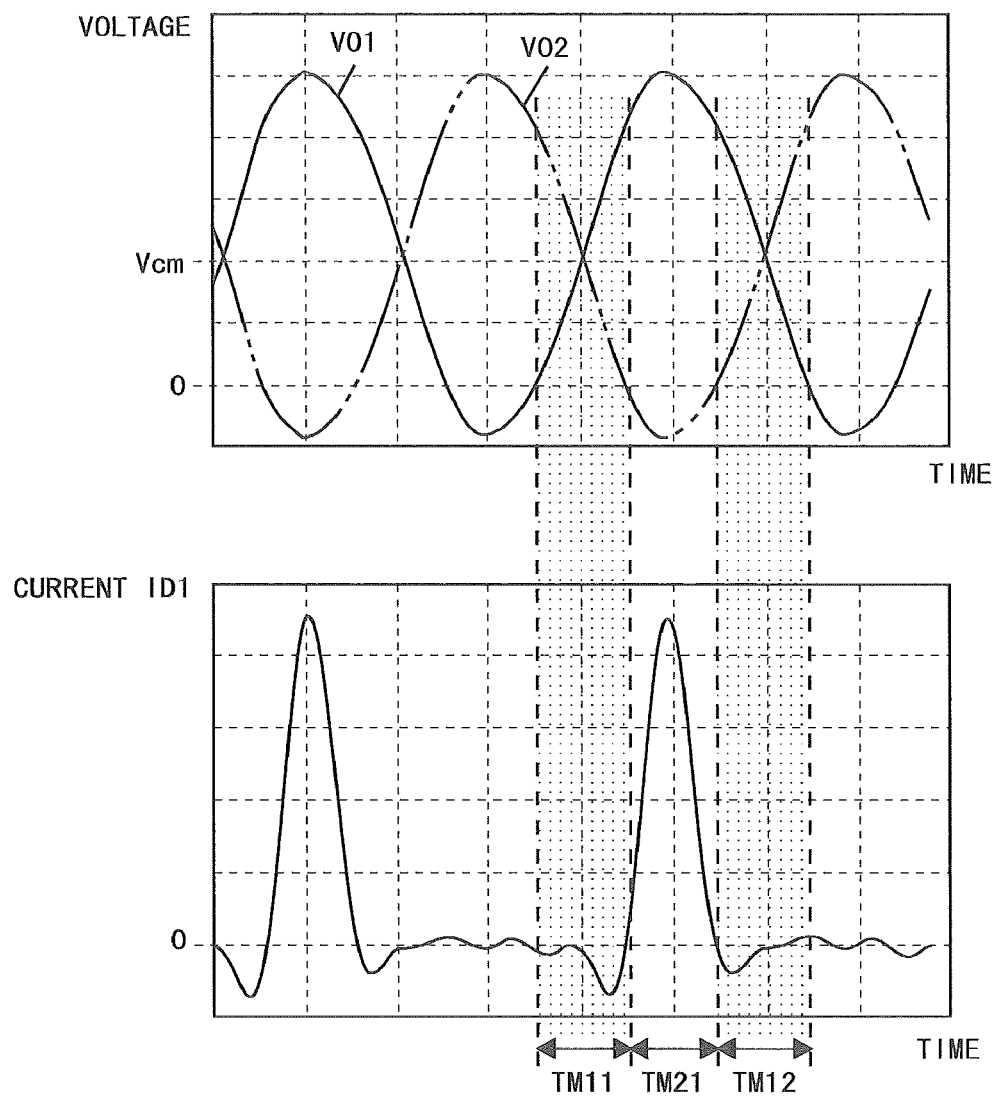
FIG. 6 is a timing chart illustrating a change in a current upon an operation of the semiconductor device according to the comparative example.

Subsequently, FIG. 6 illustrates a timing chart illustrating a change in a current upon an operation of the semiconductor device 100 according to the comparative example illustrated in FIG. 5. The timing chart illustrated in FIG. 6 illustrates the same simulation as the simulation illustrated in FIG. 4 performed on the semiconductor device 100 in FIG. 5 according to the comparative example.

As illustrated in FIG. 6, in the semiconductor device 100 according to the comparative example, AC signals inputted to the gates of the transistors have amplitudes whose centers are the common voltage Vcm. Hence, in the semiconductor device 100 according to the comparative example, durations of the periods TM11 and TM12 in which the AC signal V01 has a voltage equal to or more than the threshold voltage of the NMOS transistor MN1 and the voltage V02 of the second transistor terminal is 0 V or more are longer than the periods TM11 and TM12 illustrated in FIG. 4. By this means, the semiconductor device 100 according to the comparative example has a problem that a period in which the drain current ID1 flows in the reverse direction becomes longer that of the semiconductor device 1 according to the first embodiment. That is, the semiconductor device 100 according to the comparative example has a problem that more leakage currents whose part of electrical charges are accumulated in the second capacitor C2 flow toward the first power wire Lp1 compared to the example illustrated in FIG. 4.

As described above, the semiconductor device 1 according to the first embodiment makes the bias voltage Vb of an AC signal supplied to the gate of the NMOS transistor lower than the bias voltage (e.g. the common voltage Vcm) supplied to the gate of the PMOS transistor. Consequently, the semiconductor device 1 according to the first embodiment can reduce a reverse current (leakage current) generated in the NMOS transistor, and improve AC signal conversion efficiency.

Particularly, when energy is recovered using an environmental radio wave whose amplitude is small, an amplitude of an AC signal inputted to a transistor is very small, and rising and dropping of this AC signal show moderate voltage changes. In such a case, a period in which a voltage of the second transistor terminal of the NMOS transistor is higher than the voltage of the first transistor terminal near a timing at which the polarity of the AC signal is switched tends to become long. However, the semiconductor device 1 according to the first embodiment employs the above configuration and performs the above operation, so that it is possible to reduce as much as possible a period in which the voltage of the second transistor terminal of the NMOS transistor is higher than the voltage of the first transistor terminal near a timing at which the polarity of the AC signal is switched. That is, the semiconductor device 1 according to the first embodiment provides a significant effect of improving efficiency particularly when recovering energy from an AC signal of a small amplitude.

In this regard, Japanese Unexamined Patent Application Publication No. 2008-11584 also discloses a technique of supplying different bias voltages to a NMOS transistor and a PMOS transistor. However, a rectifier circuit disclosed in Japanese Unexamined Patent Application Publication No. 2008-11584 is provided with capacitors which block DC voltage components per gate of a transistor and resistors which supply bias voltages. When this configuration is employed, a problem that the capacitor and the resistor need to be provided on a chip and a chip area increases occurs. When, for example, the rectifier circuit disclosed in Japanese Unexamined Patent Application Publication No. 2008-11584 provided a leakage reduction effect equivalent to that of the semiconductor device 1 according to the first embodiment, it was verified that a resistance value including several MΩ needed to be used upon simulation and an increase in the chip area was significant.

Meanwhile, the semiconductor device 1 according to the first embodiment can provide a high leakage current reduction effect by using a method of connecting the gates and the capacitors without using resistors and capacitors, and using inter-element wires of the first inter-element wire L1 and the second inter-element wire L2, and, consequently, make the chip area smaller than that of the rectifier circuit disclosed in Japanese Unexamined Patent Application Publication No. 2008-11584.

Second Embodiment

Another mode of a semiconductor device 1 will be described in the second embodiment. In addition, the same components as the components described in the first embodiment will be assigned the same reference numerals and will not be described in the second embodiment.

Figure 7:
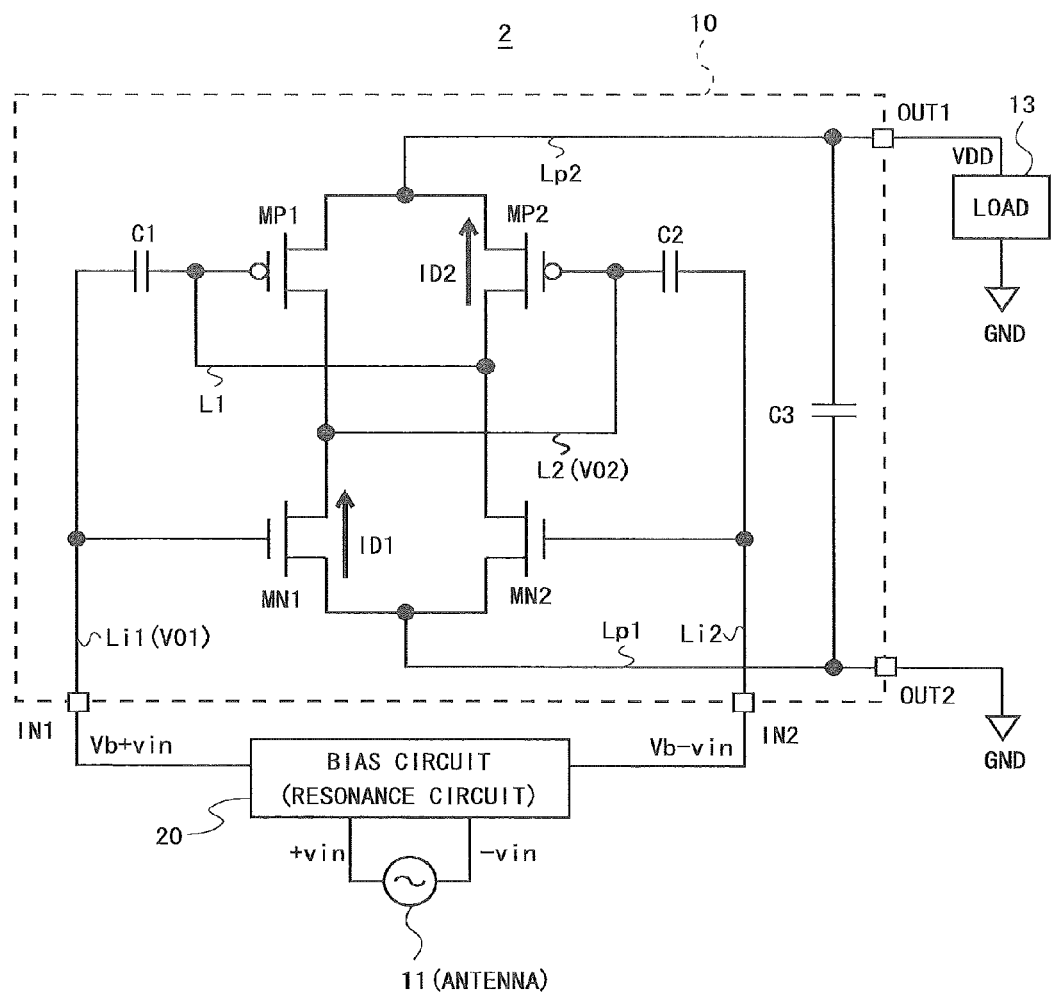
FIG. 7 is a block diagram of a semiconductor device according to a second embodiment.

FIG. 7 illustrates a block diagram of a semiconductor device 2 according to the second embodiment. As illustrated in FIG. 7, the semiconductor device 2 according to the second embodiment has a bias circuit 20 instead of a bias circuit 12 according to the first embodiment. The bias circuit 20 applies a bias voltage Vb to an AC signal outputted from an AC signal source 11 using a resonance circuit.

Figure 8:
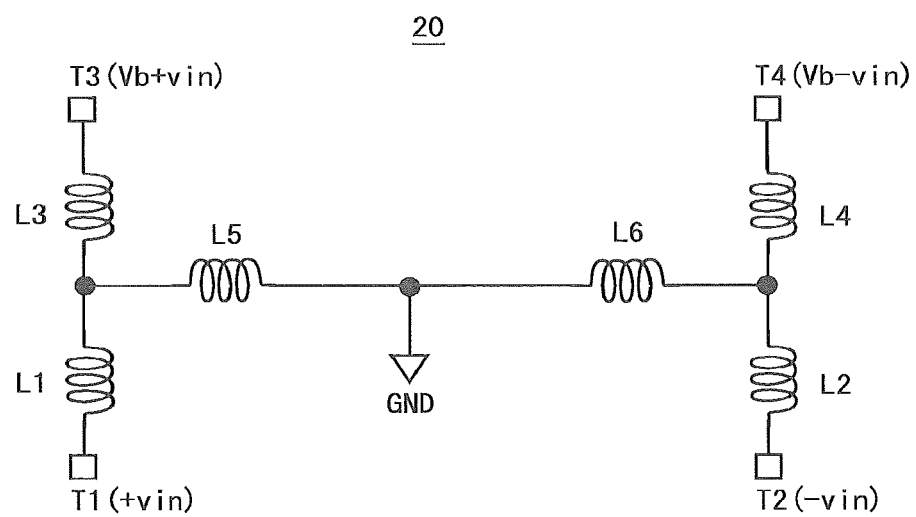
FIG. 8 is a circuit diagram of a bias circuit according to the second embodiment.

FIG. 8 illustrates an example of a circuit diagram of this bias circuit 20. As illustrated in FIG. 8, the bias circuit 20 has inductors L1 to L6. Further, FIG. 8 illustrates a first terminal T1 to a fourth terminal T4 as terminals of the bias circuit 20.

The inductors L1 and L3 are connected in series between the first terminal T1 and the third terminal T3. The inductors L2 and L4 are connected in series between the second terminal T2 and the fourth terminal T4. The inductors L5 and L6 are connected in series between a wire which connects the inductors L1 and L3 and a wire which connects the inductors L2 and L4. Further, a ground voltage GND is supplied as the bias voltage Vb to a wire which connects the inductor L5 and the inductor L6. By this means, the bias circuit 20 superimposes the AC signal on the ground voltage GND as the bias voltage Vb.

The semiconductor device 2 according to the second embodiment generates the bias voltage Vb using the resonance circuit. Consequently, the semiconductor device 2 according to the second embodiment can not only reduce a leakage current when a transistor is turned off but also increase a forward current when a transistor is turned on. Consequently, the semiconductor device 2 according to the second embodiment can improve conversion efficiency more than the semiconductor device 1 according to the first embodiment. Further, the DC bias voltage Vb supplied to the gate terminals of the NMOS transistors MN1 and MN2 are supplied only from a passive element inside the resonance circuit, and power is not consumed to generate a bias voltage, so that the semiconductor device 2 according to the second embodiment can also reduce power consumption.

Third Embodiment

Figure 9:
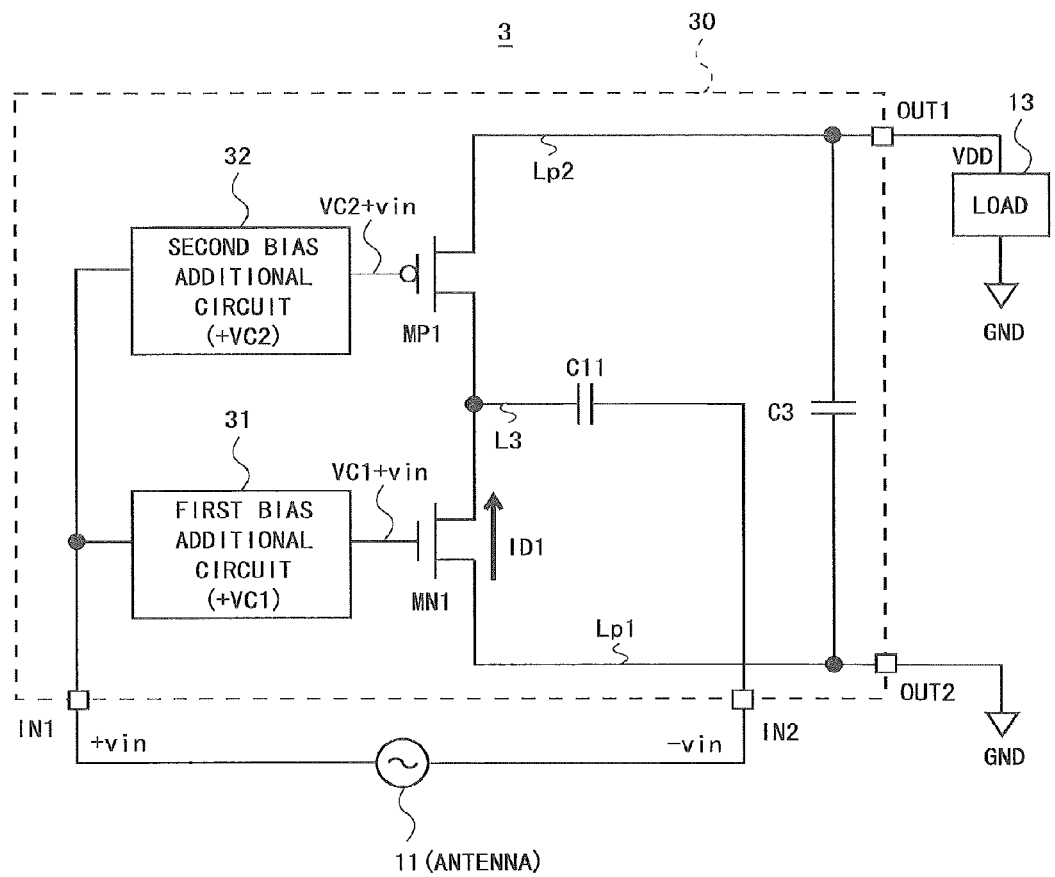
FIG. 9 is a block diagram of a semiconductor device according to a third embodiment.

Another mode of a rectifier circuit will be described in the third embodiment. Next, FIG. 9 is a block diagram illustrating a semiconductor device 3 according to the third embodiment. In addition, the same components as the components described in the first embodiment will be assigned the same reference numerals and will not be described in the second embodiment.

As illustrated in FIG. 9, the semiconductor device 3 according to third embodiment has a rectifier circuit 30 instead of a rectifier circuit 10 of a semiconductor device 1 according to the first embodiment. Further, the semiconductor device 3 does not use a bias circuit 12.

The rectifier circuit 30 has a first bias additional circuit 31, a second bias additional circuit 32, a first transistor (e.g. a NMOS transistor MN1), a second transistor (e.g. a PMOS transistor MP1), a capacitor C11 and a third capacitor C3.

The first bias additional circuit 31 generates a first input signal (e.g. VC1+vin) by superimposing a first AC signal (e.g. AC signal+vin) on a first bias voltage VC1. The NMOS transistor MN1 has a first power wire Lp1 connected with a first transistor terminal, and a gate receiving an input of the first input signal.

The second bias additional circuit 32 generates a second input signal (e.g. VC2+vin) by superimposing the first AC signal on a second bias VC2 of a higher voltage than the first bias voltage VC1. The PMOS transistor MP1 has a second power wire Lp2 connected with the first transistor, and a gate receiving an input of a second input signal.

Further, a second transistor terminal of the NMOS transistor MN1 and a second transistor terminal of the PMOS transistor MP1 are connected by an inter-element wire L3. The capacitor C11 has one end connected to the inter-element wire L3, and the other end receiving an input of the second AC signal (e.g. AC signal−vin) whose phase is inversed from the phase of the first AC signal.

Hereinafter, the first bias voltage VC1 and the second bias voltage VC will be described. The first bias voltage VC1 is a voltage lower than a common voltage Vcm generated in the inter-element wire. By setting the first bias voltage VC1 to such a voltage, it is possible to reduce a leakage current similar to the semiconductor device 1 according to the first embodiment.

The second bias voltage VC2 is a voltage (VC2>VDD−Vth) higher than a voltage obtained by subtracting a threshold voltage Vth of the PMOS transistor MP1 from a power voltage VDD. By setting the second bias voltage VC2 to such a voltage, it is possible to reduce a leakage current flowing in the PMOS transistor MP1.

Hereinafter, an operation of the semiconductor device 3 according to the third embodiment will be described. When the semiconductor device 3 according to the third embodiment receives an input of an AC signal which raises a gate voltage of the NMOS transistor MN1, the NMOS transistor MN1 enters an on state and the PMOS transistor MP1 enters an off state. In this case, an input terminal IN2 side terminal of the capacitor C11 receives an input of a low voltage. Hence, when receiving an input of an AC signal which raises a gate voltage of the NMOS transistor MN1, the semiconductor device 3 enters a period in which the capacitor C11 is changed by a drain current ID1.

Meanwhile, when the semiconductor device 3 according to the third embodiment receives an input of an AC signal which lowers a gate voltage of the NMOS transistor MN1, the NMOS transistor MN1 enters an off state and the PMOS transistor MP1 enters an on state. Further, the input terminal IN2 side terminal of the capacitor C11 receives an input of a high voltage. Hence, when receiving an input of an AC signal which lowers the gate voltage of the NMOS transistor MN1, the semiconductor device 3 enters a period in which electrical charges accumulated in the capacitor C11 are changed in a third capacitor C3.

In the above operation, the semiconductor device 3 according to the third embodiment makes a first bias voltage VC1 to be superimposed on the AC signal inputted to the NMOS transistor MN1 lower than the common voltage Vcm generated in the third inter-element wire L3, and makes a bias voltage of the AC signal inputted to the PMOS transistor MP1 higher than the first bias voltage VC1. Consequently, the semiconductor device 3 according to the third embodiment can reduce a leakage current more than the semiconductor device 1 according to the first embodiment.

Further, as illustrated in FIG. 9, the semiconductor device 3 according to the third embodiment can be formed by a smaller number of circuit elements than those of the semiconductor device 1 according to the first embodiment.

Fourth Embodiment

An example of a semiconductor device in which a plurality of rectifier circuits 10 according to the first embodiment is used will be described in the fourth embodiment. Next, FIG. 10 is a block diagram of a semiconductor device 4 according to the fourth embodiment.

Figure 10:
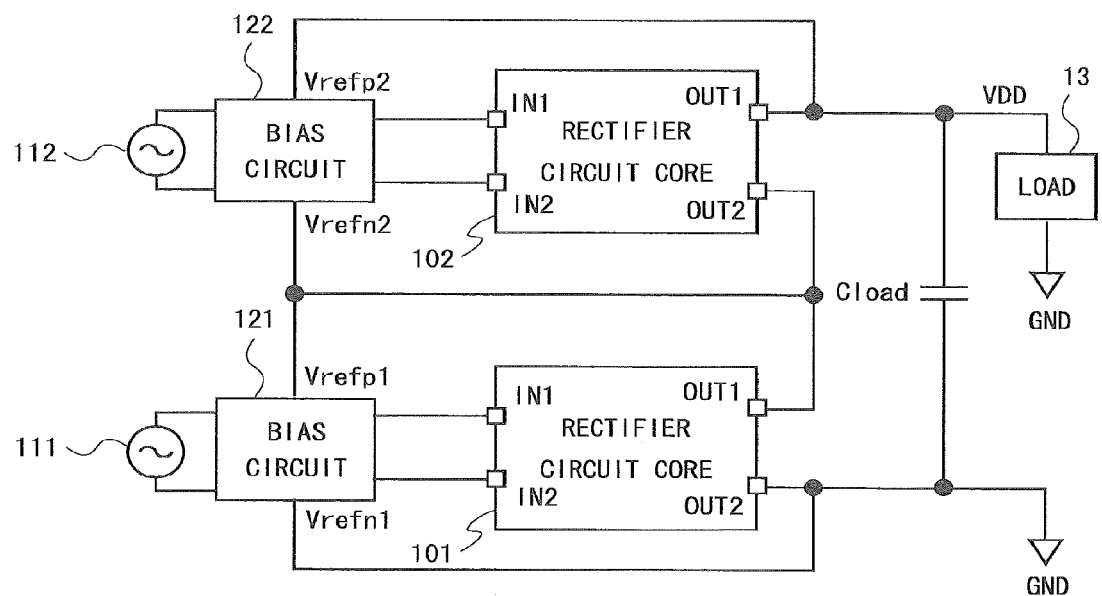
FIG. 10 is a block diagram of a semiconductor device according to a fourth embodiment.

As illustrated in FIG. 10, in the semiconductor device 4 according to the fourth embodiment, a rectifier circuit core 101 and a rectifier circuit core 102 are connected in series. These rectifier circuit core 101 and rectifier circuit core 102 are the same as the rectifier circuit 10. More specifically, the rectifier circuit core 101 and the rectifier circuit core 102 are connected in cascade with a first output terminal OUT1 provided on a first power wire of the rectifier circuit core 101 arranged at a lower stage, and a second output terminal OUT2 provided on a second power wire of the rectifier circuit core 102 arranged at an upper stage. In addition, in the rectifier circuit core 101 and the rectifier circuit core 102, the second output terminal OUT2 and the first output terminal OUT1 are connected in cascade through an internal circuit. Further, in the semiconductor device 4, a smoothing capacitor Cload is connected between the first power wire of the rectifier circuit core 101 arranged at the first stage and the second power wire of the rectifier circuit core 102 arranged at the final stage.

In addition, in the semiconductor device 4, bias circuits (e.g. bias circuits 121 and 122) and AC signal sources (e.g. AC signal sources 111 and 112) are connected per rectifier circuit.

Thus, by connecting a plurality of rectifier circuits 10 in cascade, it is possible to add a voltage generated by each rectifier circuit 10 and supply to a load 13 a power voltage VDD higher than the voltages generated by the rectifier circuits 10.

Fifth Embodiment

Another example of a semiconductor device in which a plurality of rectifier circuits 10 according to the first embodiment is used will be described in the fifth embodiment. Next, FIG. 11 illustrates a block diagram of a semiconductor device 5 according to the fifth embodiment.

Figure 11:
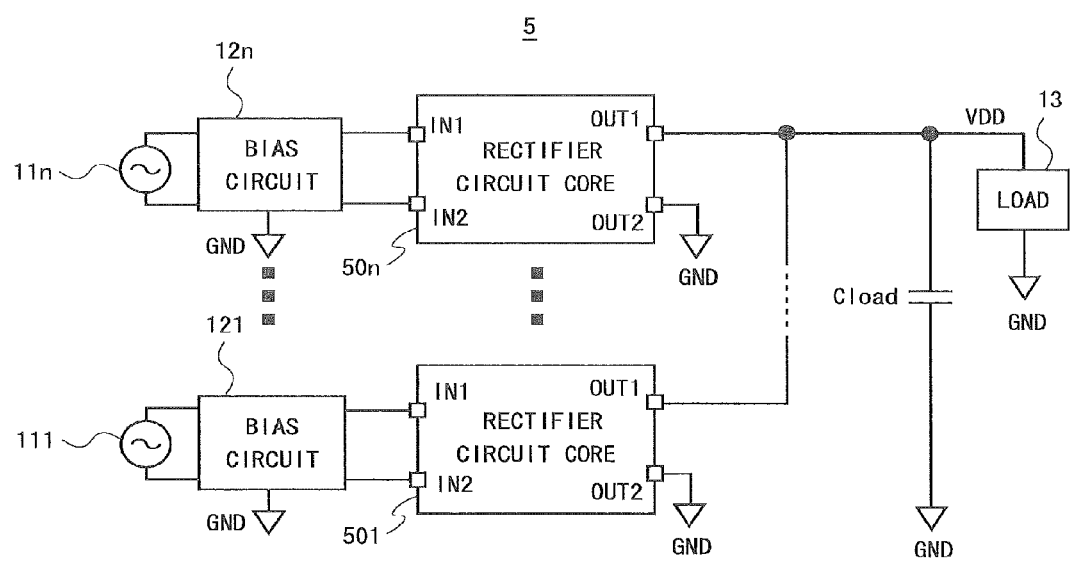
FIG. 11 is a block diagram of a semiconductor device according to a fifth embodiment.

As illustrated in FIG. 11, in the semiconductor device 5 according to the fifth embodiment, n rectifier circuits 10 are connected in parallel. FIG. 11 illustrates a rectifier circuit core 501 and a rectifier circuit core 50n among the n rectifier circuits 10. More specifically, in the semiconductor device 5, first output terminals OUT1 of the rectifier circuit core 501 to the rectifier circuit core 50n are connected to a load 13 through a common wire. Further, a smoothing capacitor Cload is connected between a common wire and a ground wire.

In addition, in the semiconductor device 5, bias circuits (e.g. bias circuits 121 to 12n) and AC signal sources (e.g. AC signal sources 111 to 11n) are connected per rectifier circuit.

Thus, by connecting a plurality of rectifier circuits 10 in parallel, it is possible to realize higher current supply performance than a power supply generated by one rectifier circuit 10. In addition, by using a plurality of rectifier circuits 10 connected in cascade as in the semiconductor device 4 according to the fourth embodiment as one set of power supplies and forming matrix connection of further connecting sets of power supplies in parallel, it is possible to simultaneously realize supply of a high voltage and high current supply performance.

Sixth Embodiment

A semiconductor device which supplies a highly stable power supply using a rectifier circuit 10 according to the first embodiment will be described in the sixth embodiment. Next, FIG. 12 illustrates a block diagram of a semiconductor device 6 according to the sixth embodiment.

Figure 12:
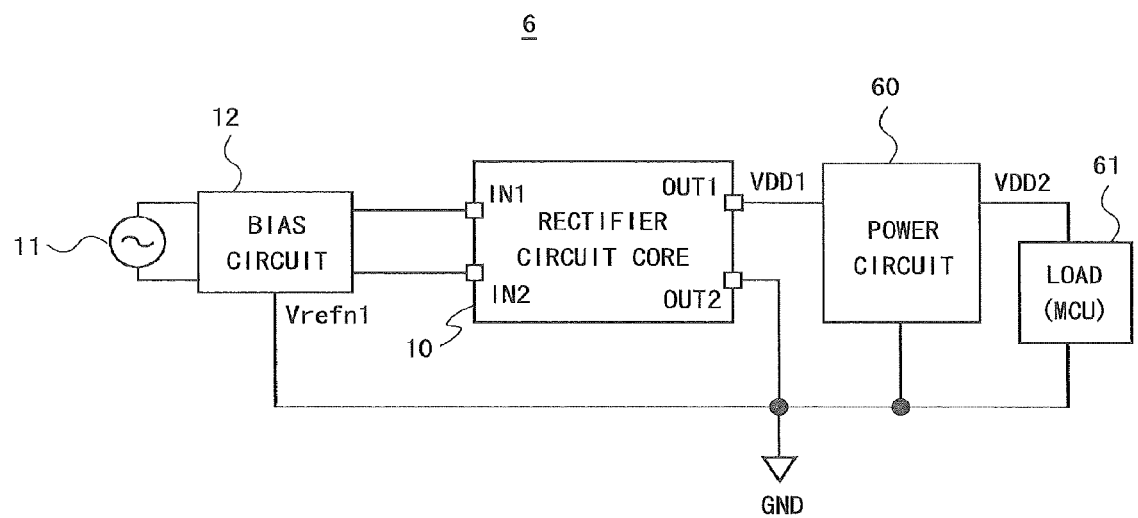
FIG. 12 is a block diagram of a semiconductor device according to a sixth embodiment.

As illustrated in FIG. 12, the semiconductor device 6 according to the sixth embodiment has a power circuit 60 between the rectifier circuit 10 and a load 61. The power circuit 60 generates a second power voltage VDD2 by stepping up or stepping down a first power voltage VDD1 transmitted through a second power wire.

Thus, by providing the power circuit 60 between the rectifier circuit 10 and the load 61, it is possible to maintain a fixed voltage to be supplied to the load 61 even when a MCU (Micro Controller Unit) whose fluctuation of power consumption is significant is connected as the load 61.

Seventh Embodiment

Another mode of a semiconductor device 1 according to the first embodiment will be described in the seventh embodiment. In addition, the same components as the components described in the first embodiment will be assigned the same reference numerals and will not be described in the seventh embodiment.

Figure 13:
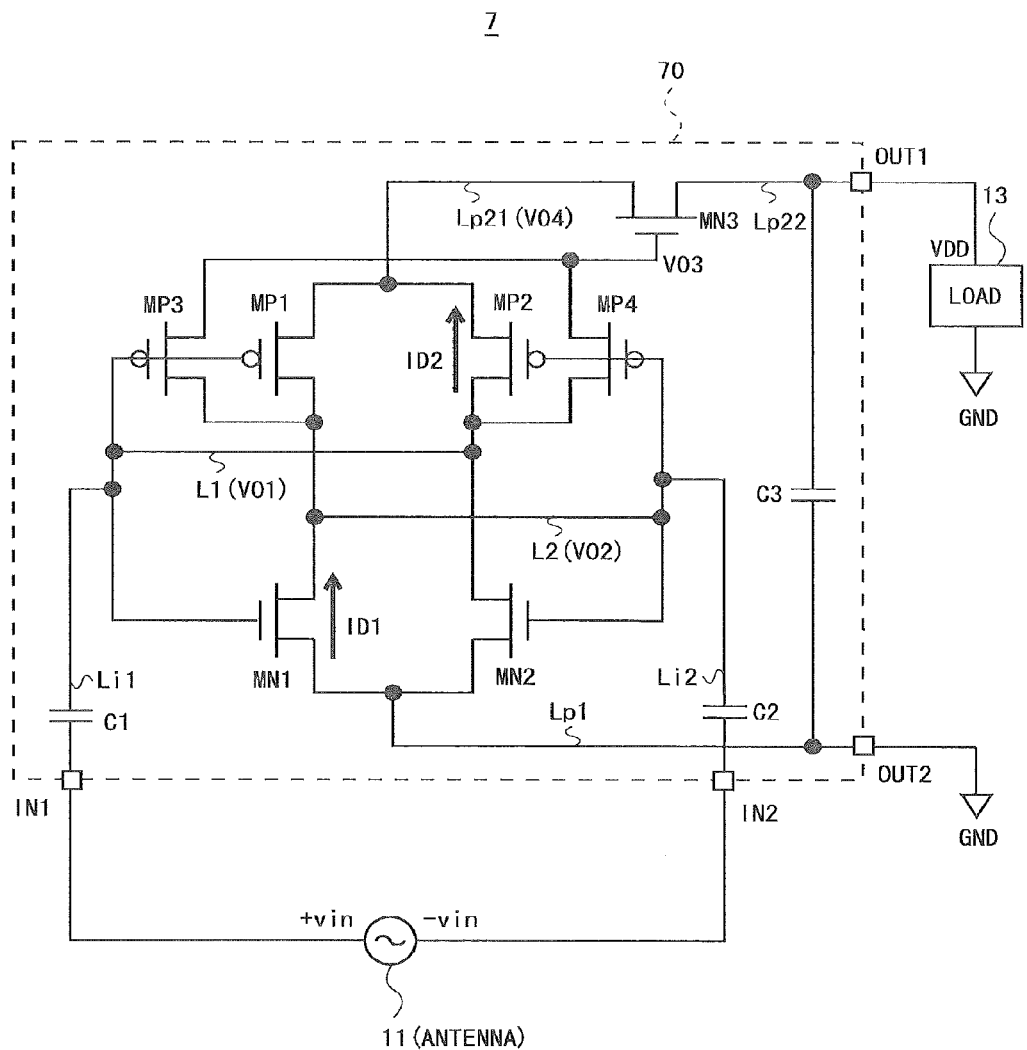
FIG. 13 is a block diagram of a semiconductor device according to a seventh embodiment.

FIG. 13 is a block diagram of a semiconductor device 7 according to the seventh embodiment. As illustrated in FIG. 13, the semiconductor device 7 according to the seventh embodiment has a rectifier 70 instead of a rectifier circuit 10. Further, the semiconductor device 7 supplies an AC signal outputted from an AC signal source 11, to a rectifier circuit 70 without a bias circuit 12.

The rectifier circuit 70 has a first transistor (e.g. a NMOS transistor MN1), a second transistor (e.g. a NMOS transistor MN2), a third transistor (e.g. a PMOS transistor MP1), a fourth transistor (e.g. a PMOS transistor MP2), a fifth transistor (e.g. a PMOS transistor MP3), a sixth transistor (e.g. a PMOS transistor MP4), a seventh transistor (e.g. a NMOS transistor MN3) and first, second and third capacitors C1, C2 and C3. In addition, the NMOS transistor MN3 is inserted in a second power wire Lp2 in the semiconductor device 7 according to the seventh embodiment, so that a second power wire of the second power wire Lp2 closer to the PMOS transistors MP1 and MP2 side than the NMOS transistor MN3 is Lp21, and a second power wire closer to a first output terminal OUT1 side than the NMOS transistor MN3 is Lp22.

In the rectifier circuit 70, a first input wire Li1 is connected with a first input terminal IN1 through the first capacitor C1. Further, in the rectifier circuit 70, a second input wire Li2 is connected with a second input terminal IN2 through the second capacitor C2. The first input wire Li1 and the second input wire Li2 are wires to which AC signals whose phases are inverted from each other are transmitted.

The NMOS transistor MN1 has a first power wire Lp1 connected with a first transistor terminal, and a gate connected with the input wire Li1. The NMOS transistor MN2 has the first power wire Lp1 connected with the first transistor terminal, and a gate connected with the second input wire Li2.

The PMOS transistor MP1 has the second power wire Lp21 connected with the first transistor terminal, a second transistor terminal connected with a second transistor terminal of the NMOS transistor MN1 and a gate connected with the first input wire Li1. The PMOS transistor MP2 has the second power wire Lp21 connected with the first transistor terminal, a second transistor terminal connected with the second transistor terminal of the NMOS transistor MN2 and a gate connected with the second input wire Li2.

The PMOS transistor MP3 has a gate connected with the first input wire Li1, and a second transistor terminal connected with the second transistor terminal of the PMOS transistor MP1. The PMOS transistor MP4 has a gate connected with the second input wire Li2, and a second transistor terminal connected with the second transistor terminal of the PMOS transistor MP2. The NMOS transistor MN3 is inserted in the second power wire Lp2 (between the second power wire Lp21 and the second power wire Lp22), and has a gate connected to the first transistor terminal of the PMOS transistor MP3 and the first transistor terminal of the PMOS transistor MP4.

Further, even in the rectifier circuit 70, the third capacitor C3 is connected between the first power wire Lp1 and the second power wire Lp2.

Figure 14:
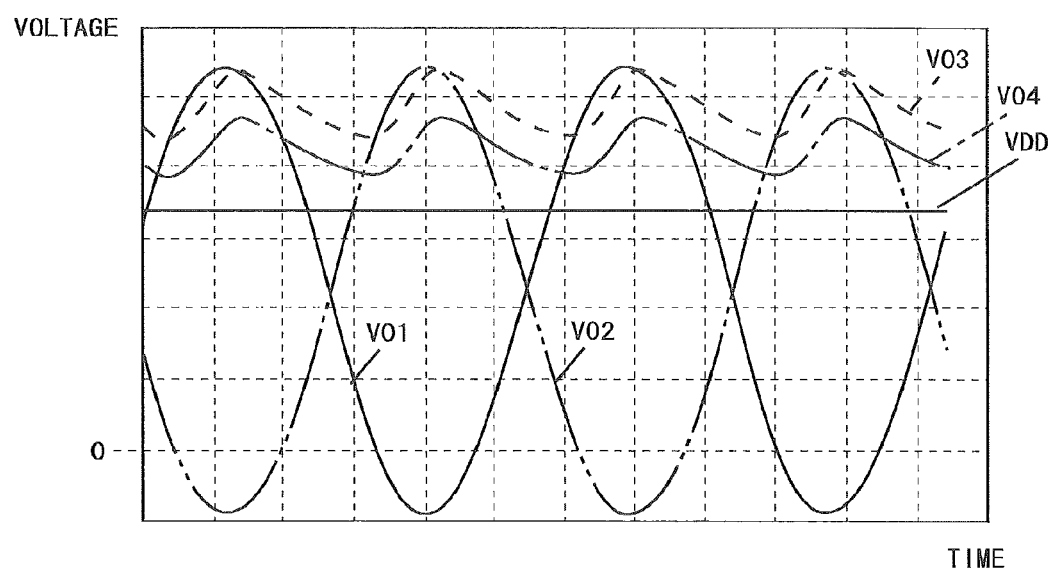
FIG. 14 is a timing chart illustrating operations of the semiconductor device according to the seventh embodiment.

Subsequently, an operation of the semiconductor device 7 according to the seventh embodiment will be described. Next, FIG. 14 illustrates a timing chart illustrating the operation of the semiconductor device 7 according to the seventh embodiment. As illustrated in FIG. 14, in the semiconductor device 7 according to the seventh embodiment, two AC signals have amplitudes whose centers are a common voltage Vcm. Further, a gate voltage V03 of the NMOS transistor MN3 rises every time a voltage of one of two AC signals (voltages V01 and V02) becomes high. Furthermore, the voltage of the second power wire Lp2 changes by a voltage which is lower a threshold voltage of the NMOS transistor MN3 than the gate voltage V03 of the NMOS transistor MN3. By this means, a power voltage VDD generated at a first output terminal OUT1 is a roughly fixed voltage at a voltage slightly lower than a voltage fluctuation of the second power wire Lp21. This is because the third capacitor C3 is changed by the first capacitor C1 or the second capacitor C2 according to the change in the AC signals V01 and V02.

In this regard, the semiconductor device 7 according to the seventh embodiment provides an effect of reducing a leakage current when the AC signal source 11 stops outputting signals (this state is referred to as a null signal state). A leakage current in this null signal state is referred to as a static leakage current below.

Next, an operation of the semiconductor device 7 in the null signal state will be described. When the semiconductor device 7 according to the seventh embodiment enters the null signal state, immediately after the semiconductor device 7 enters the null signal state, gate voltages of the NMOS transistors MN1 and MN2 and the PMOS transistors MP1 to MP4 become voltages near the common voltage Vcm. Hence, a leakage current flowing from the second power wire Lp22 to the first power wire Lp1 is generated.

However, in this case, electrical charges are also drawn from a wire connected to the gate of the NMOS transistor MN3. Subsequently, electrical charges are drawn from a wire connected to the gate of the NMOS transistor MN3, and, when the gate voltage V03 of the NMOS transistor MN3 lowers below the threshold voltage of the NMOS transistor MN3, the NMOS transistor MN3 enters a blocked state. Further, when the NMOS transistor MN3 enters the blocked state, a leakage current flowing from the second power wire Lp21 to the first power wire Lp1 is blocked.

Figure 15:
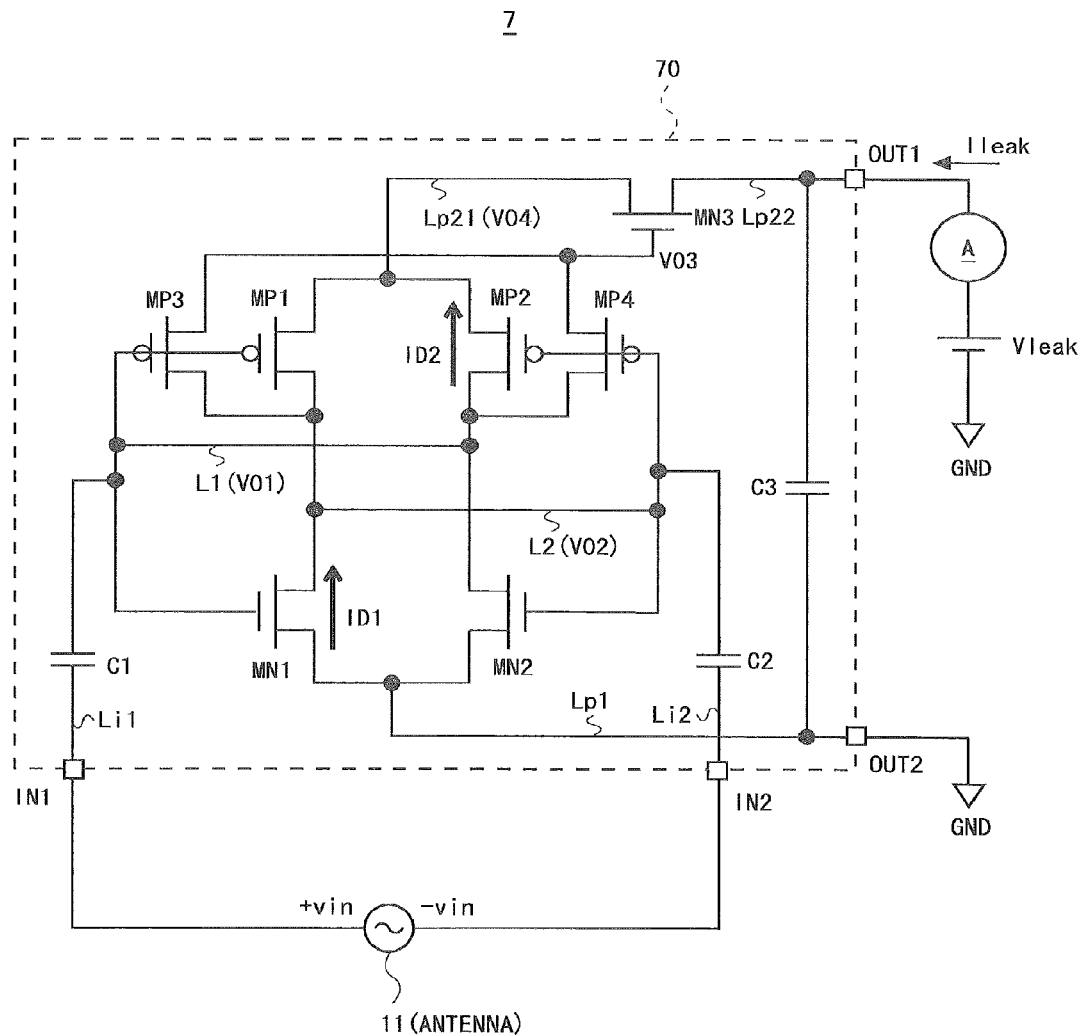
FIG. 15 is a view for explaining simulation conditions of a leakage current amount in the semiconductor device according to the seventh embodiment.

An effect of reducing this static leakage current will be described below. First, a simulation circuit which verifies the effect of reducing a static leakage current will be described. FIG. 15 is a view for explaining simulation conditions of a leakage current amount in the semiconductor device according to the seventh embodiment. As illustrated in FIG. 15, in this simulation, a circuit formed by connecting in series a voltage source Vleak and an ammeter is provided instead of a load 13. Further, FIG. 16 is a graph illustrating a simulation result obtained by using the simulation circuit illustrated in FIG. 15.

Figure 16:
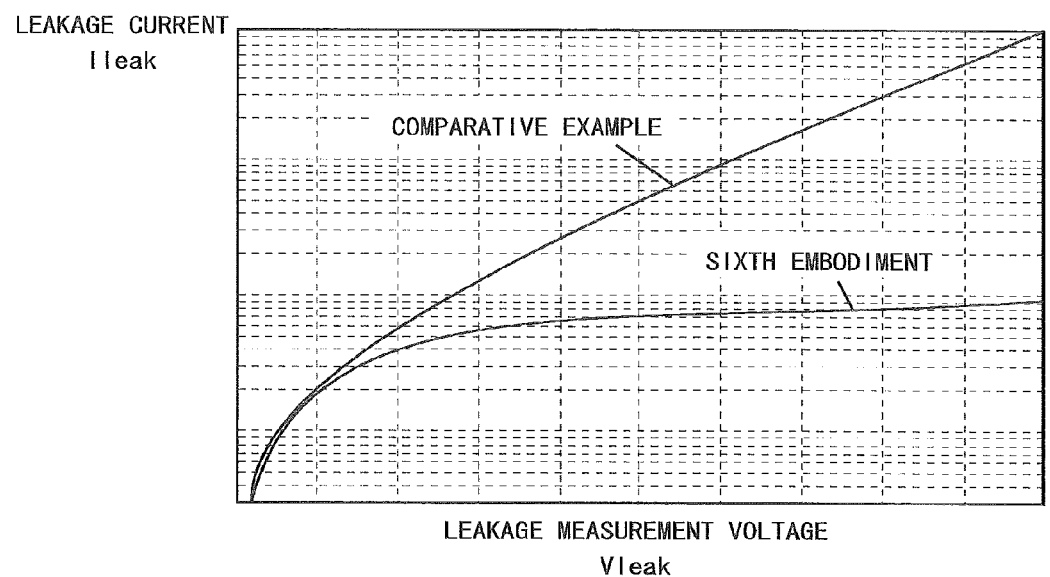
FIG. 16 is a graph illustrating a simulation result of a leakage current in the semiconductor device according to the seventh embodiment.

FIG. 16 illustrates as a comparative example a result obtained by performing a simulation on the circuit illustrated in FIG. 5 according to the comparative example by using the simulation conditions illustrated in FIG. 15, together with the simulation result of the semiconductor device 7 according to the seventh embodiment.

As illustrated in FIG. 16, a leakage current Ileak increases as the voltage of a voltage source Vleak becomes higher in a semiconductor device 100 according to the comparative example. Meanwhile, when the voltage of the voltage source Vleak is a fixed voltage or more in the semiconductor device 7 according to the seventh embodiment, an increase in the leakage current Ileak becomes small such that the leakage current Ileak is asymptotic to a fixed value. At a right end portion in the graph illustrated in FIG. 16, the leakage current of the semiconductor device 7 according to the seventh embodiment becomes roughly two digits smaller than that of the semiconductor device 1 according to the comparative example.

As described above, the semiconductor device 7 according to the seventh embodiment can reduce a leakage current in a null signal state where an AC signal outputted from the AC signal source 11 stops. This effect is particularly high in case of a mode which is used by connecting in series a plurality of rectifier circuits 10 as illustrated in FIG. 10 or in case of a mode which is used by connecting in parallel a plurality of rectifier circuits 10 as illustrated in FIG. 11. This is because, when a plurality of rectifier circuits 10 is connected, if the AC signal source corresponding to one rectifier circuit 10 of a plurality of rectifier circuits 10 enters a null signal state, power generated by the other rectifier circuits 10 is drawn by the rectifier circuit 10 in the null signal state, and power is lost more than power lost when one AC signal source simply enters a null signal state. Even in this state, it is possible to prevent the rectifier circuit 10 in the null signal state from wasting power generated by the other operating rectifier circuits 10 by using the semiconductor device 7 according to the seventh embodiment, so that the semiconductor device 7 is effective to improve conversion efficiency.

Eighth Embodiment

Another mode of a semiconductor device 1 according to the first embodiment will be described in the eighth embodiment. In addition, the same components as the components described in the first embodiment will be assigned the same reference numerals and will not be described in the eighth embodiment.

Figure 17:
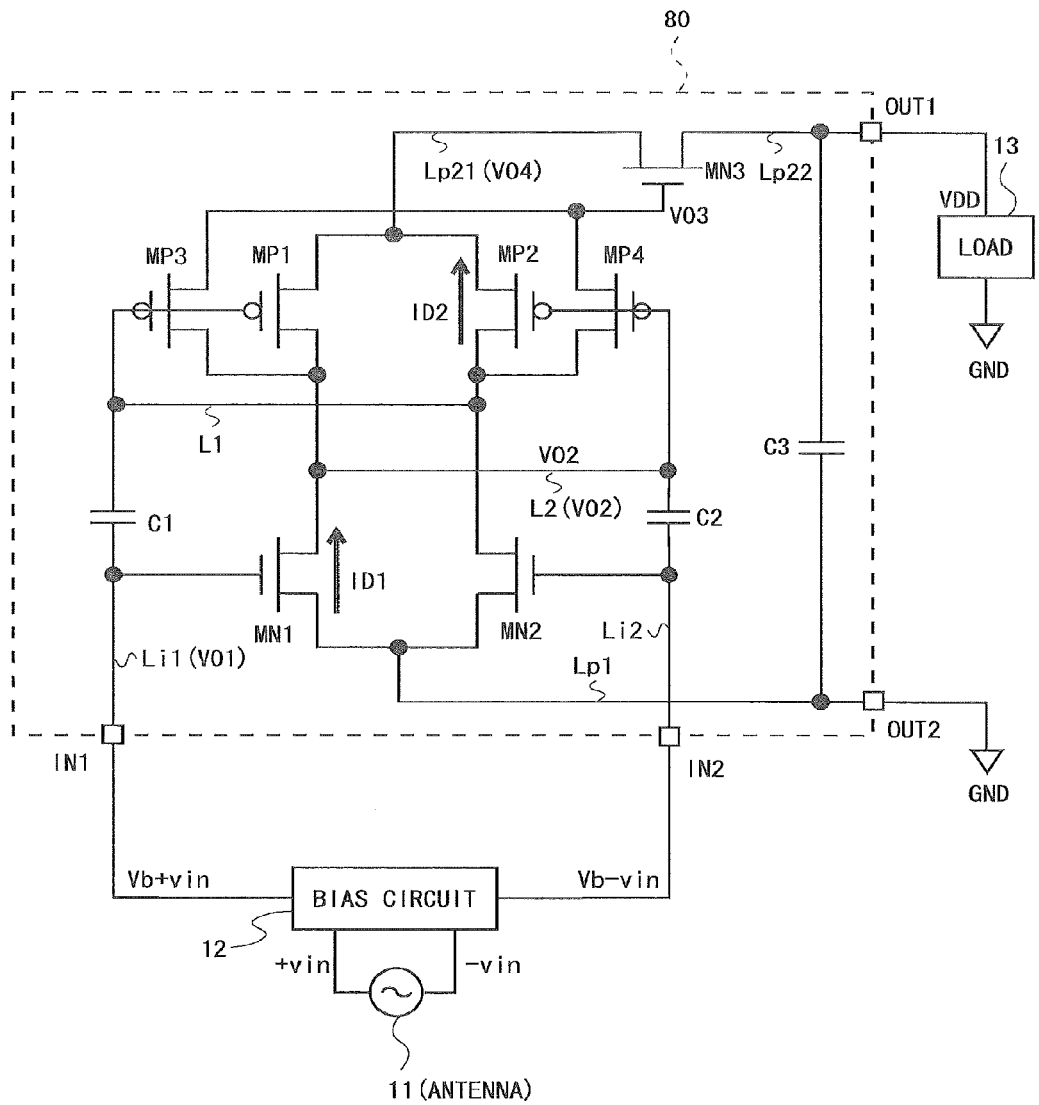
FIG. 17 is a block diagram of a semiconductor device according to an eighth embodiment.

FIG. 17 is a block diagram of a semiconductor device 8 according to the eight embodiment. As illustrated in FIG. 17, the semiconductor device 8 according to the eighth embodiment has a rectifier circuit 80 instead of a rectifier circuit 10 according to the first embodiment. The rectifier circuit 80 is formed by adding PMOS transistors MP3 and MP4 and a NMOS transistor MN3 described using the rectifier 70, to the rectifier circuit 10. That is, in the rectifier circuit 80, the PMOS transistor MP3 has a second transistor terminal connected to a second inter-element wire L2, and a gate connected to the other end of a first capacitor C1. Further, the PMOS transistor MP4 has a second transistor terminal connected to a first inter-element wire L1, and a gate connected to the other end of a second capacitor C2. The NMOS transistor MN3 is inserted in a second power wire Lp2 (between a second power wire Lp21 and a second power wire Lp22), and has a gate connected to the first transistor terminal of the PMOS transistor MP3 and the first transistor terminal of the PMOS transistor MP4.

By adding to the rectifier circuit 10 the PMOS transistors MP3 and MP4 and the NMOS transistor MN3 described using the rectifier circuit 70 according to the seventh embodiment, it is possible to reduce a dynamic leakage current described in the first embodiment and, in addition, a static leakage current described in the seventh embodiment. Consequently, the semiconductor device 8 according to the eighth embodiment can realize a high leakage current reduction effect, and further improve conversion efficiency.

Ninth Embodiment

Another mode of a semiconductor device 3 according to the third embodiment will be described in the ninth embodiment. In addition, the same components as the components described in the third embodiment will be assigned the same reference numerals and will not be described in the ninth embodiment.

Figure 18:
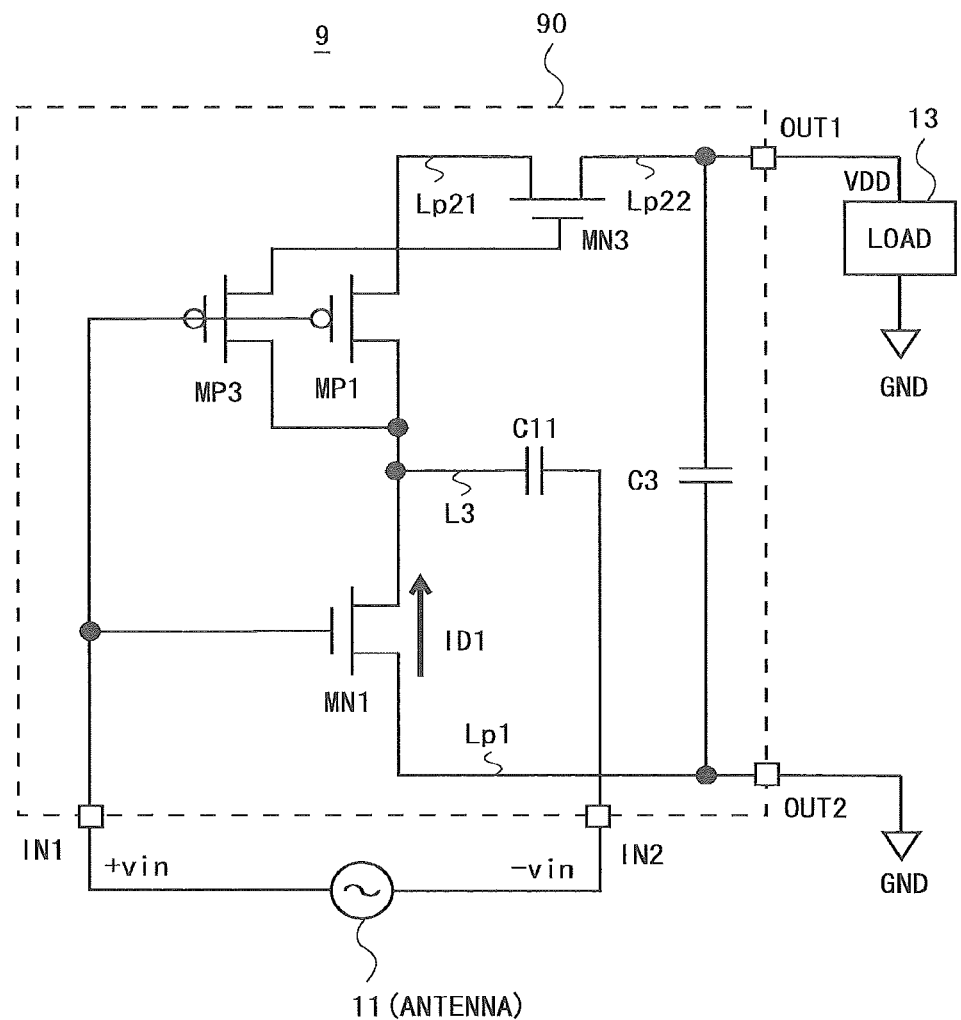
FIG. 18 is a block diagram of a semiconductor device according to a ninth embodiment.

FIG. 18 is a block diagram of a semiconductor device 9 according to the ninth embodiment. As illustrated in FIG. 18, the semiconductor device 9 according to the ninth embodiment is formed by applying to a semiconductor device 7 according to the seventh embodiment the same modification as that applied to the semiconductor device 3 according to the first to third embodiments. The semiconductor device 9 according to the ninth embodiment has a rectifier circuit 90 instead of a rectifier circuit 30. The rectifier circuit 90 is formed by adding to a rectifier circuit 30 a PMOS transistor MP3 and a NMOS transistor MN3 described using a rectifier circuit 70, and removing a first bias additional circuit 31 and a second bias additional circuit 32. That is, in the rectifier circuit 90, the rectifier circuit 90 has a second transistor terminal connected to a second transistor terminal of the PMOS transistor MP1, and a gate receiving an input of a first AC signal. The NMOS transistor MN3 is inserted in a second power wire Lp2 (between a second power wire Lp21 and a second power wire Lp22), and has a gate connected to a first transistor terminal of the PMOS transistor MP3.

By adding to the rectifier circuit 30 the PMOS transistors MP3 and MP4 and the NMOS transistor MN3 described using the rectifier circuit 70 according to the seventh embodiment as described above, the rectifier circuit 30 according to the third embodiment can reduce a static leakage current described in the seventh embodiment. Consequently, the semiconductor device 9 according to the ninth embodiment can realize a high leakage current reduction effect, and further improve conversion efficiency.

In addition, the bias additional circuits 31 and 32 of the semiconductor device 3 illustrated in FIG. 9 according to the third embodiment can also be applied to the semiconductor device 9 according to the ninth embodiment. By applying the bias additional circuits 31 and 32, the semiconductor device 9 according to the ninth embodiment can reduce a dynamic leakage current.

The first to ninth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

The following points of view can be considered according to the above embodiments.

(Supplementary Note 1)

In a semiconductor device which has a rectifier circuit, the rectifier circuit has: first and second input wires to which AC signals whose phases are inverted from each other are transmitted; a first transistor of a first conductive type which has a first power wire connected with a first transistor terminal and a gate connected with the first input wire; a second transistor of the first conductive type which has the first power wire connected with a first transistor terminal, and a gate connected with the second input wire; a third transistor of a second conductive type which has a second power wire connected with a first transistor terminal, a second transistor terminal connected with a second transistor terminal of the first transistor and a gate connected with the first input capacitor; a fourth transistor of the second conductive type which has the second power wire connected with a first transistor terminal, a second transistor terminal connected with a second transistor terminal of the second transistor and a gate connected with the second input capacitor; a fifth transistor of the second conductive type which has a gate connected with the first input wire, and a second transistor terminal connected with a second transistor terminal of the third transistor; a sixth transistor of the second conductive type which has a gate connected with the second input wire, and a second transistor terminal connected to a second transistor terminal of the fourth transistor; and a seventh transistor of the first conductive type which is inserted in the second power wire and has a gate connected to a first transistor terminal of the fifth transistor and a first transistor terminal of the sixth transistor.

(Supplementary Note 2)

In a semiconductor device which has a rectifier circuit, the rectifier circuit has: a first bias circuit which generates a first input signal by superimposing a first AC signal on a first bias voltage; a first transistor of a first conductive type which has a first power wire connected with a first transistor terminal and a gate receiving an input of the first input signal; a second bias circuit which generates a second input signal by superimposing the first AC signal on a second bias voltage which is a voltage higher than the first bias voltage; a second transistor of a second conductive type which has a second power wire connected to a first transistor terminal, and a gate receiving an input of the second input signal; an inter-element wire which connects a second transistor terminal of the first transistor, and a second transistor terminal of the second transistor; and a capacitor which has one end connected to the inter-element wire and an other end receiving an input of a second AC signal whose phase is inverted from a phase of the first AC signal.

(Supplementary Note 3)

In a semiconductor device which has a rectifier circuit, the rectifier circuit has: a first transistor of a first conductive type which has a first power wire connected with a first transistor terminal and a gate receiving an input of the first AC signal; a second transistor of a second conductive type which has a second power wire connected with a first transistor terminal, and a gate receiving an input of the first AC signal; a third transistor of the second conductive type which has a gate connected with the first AC signal, and a second transistor terminal connected to a second transistor terminal of the second transistor; a fourth transistor of the first conductive type which is inserted in the second power wire and has a gate connected to a first transistor terminal of the third transistor; an inter-element wire which connects a second transistor terminal of the first transistor, a second transistor terminal of the second transistor and a second transistor terminal of the third transistor; and a capacitor which has one end connected to the inter-element wire and an other end receiving an input of a second AC signal whose phase is inverted from a phase of the first AC signal.

What is claimed is:

1. A semiconductor device comprising a rectifier circuit, wherein the rectifier circuit includes:
    first and second input wires to which AC signals whose phases are inverted from each other are transmitted;
    a first transistor of a first conductive type which has a first power wire connected with a first transistor terminal and a gate connected with the first input wire;
    a second transistor of the first conductive type which has the first power wire connected with a first transistor terminal, and a gate connected with the second input wire;
    a third transistor of a second conductive type which has a second power wire connected with a first transistor terminal, a second transistor terminal connected with a second transistor terminal of the first transistor and a gate connected with the first input capacitor;
    a fourth transistor of the second conductive type which has the second power wire connected with a first transistor terminal, a second transistor terminal connected with a second transistor terminal of the second transistor and a gate connected with the second input capacitor;
    a fifth transistor of the second conductive type which has a gate connected with the first input wire, and a second transistor terminal connected with a second transistor terminal of the third transistor;
    a sixth transistor of the second conductive type which has a gate connected with the second input wire, and a second transistor terminal connected to a second transistor terminal of the fourth transistor; and
    a seventh transistor of the first conductive type which is inserted in the second power wire and has a gate connected to a first transistor terminal of the fifth transistor and a first transistor terminal of the sixth transistor.

2. The semiconductor device according to claim 1, further comprising a third capacitor that is connected between the first power wire and the second power wire.

3. The semiconductor device according to claim 1, further comprising:
- a plurality of rectifier circuits that is formed by connecting in cascade a first output terminal provided on the first power wire and a second output terminal provided on the second power wire; and
- a smoothing capacitor that is connected between the first power wire of the rectifier circuit arranged at a first stage and the second power wire of the rectifier circuit arranged at a final stage.

4. The semiconductor device according to claim 1, further comprising:
- a plurality of rectifier circuits that includes loads connected with a first output terminal provided on the first power wire through a common wire, respectively; and
- a smoothing capacitor that is connected between the common wire and a ground wire.

5. The semiconductor device according to claim 1, further comprising a power circuit that is connected between the first power wire and the second power wire, and that generates a second power voltage by performing at least one of stepping up and stepping down of a first power voltage transmitted through the second power wire.

6. A semiconductor device comprising a rectifier circuit, wherein the rectifier circuit includes:
- a first bias circuit which generates a first input signal by superimposing a first AC signal on a first bias voltage;
- a first transistor of a first conductive type which has a first power wire connected with a first transistor terminal and a gate receiving an input of the first input signal;
- a second bias circuit which generates a second input signal by superimposing the first AC signal on a second bias voltage which is a voltage higher than the first bias voltage;
- a second transistor of a second conductive type which has a second power wire connected to a first transistor terminal, and a gate receiving an input of the second input signal;
- an inter-element wire which connects a second transistor terminal of the first transistor, and a second transistor terminal of the second transistor; and
- a capacitor which has one end connected to the inter-element wire and an other end receiving an input of a second AC signal whose phase is inverted from a phase of the first AC signal.

7. The semiconductor device according to claim 6, further comprising a third capacitor that is connected between the first power wire and the second power wire.

8. The semiconductor device according to claim 6, further comprising:
- a plurality of rectifier circuits that is formed by connecting in cascade a first output terminal provided on the first power wire and a second output terminal provided on the second power wire; and
- a smoothing capacitor that is connected between the first power wire of the rectifier circuit arranged at a first stage and the second power wire of the rectifier circuit arranged at a final stage.

9. The semiconductor device according to claim 6, further comprising:
- a plurality of rectifier circuits that includes loads connected with a first output terminal provided on the first power wire through a common wire, respectively; and
- a smoothing capacitor that is connected between the common wire and a ground wire.

10. The semiconductor device according to claim 6, further comprising a power circuit that is connected between the first power wire and the second power wire, and that generates a second power voltage by performing at least one of stepping up and stepping down of a first power voltage transmitted through the second power wire.

11. A semiconductor device comprising a rectifier circuit, wherein the rectifier circuit includes:
- a first transistor of a first conductive type which has a first power wire connected with a first transistor terminal and a gate receiving an input of the first AC signal;
- a second transistor of a second conductive type which has a second power wire connected with a first transistor terminal, and a gate receiving an input of the first AC signal;
- a third transistor of the second conductive type which has a gate connected with the first AC signal, and a second transistor terminal connected to a second transistor terminal of the second transistor;
- a fourth transistor of the first conductive type which is inserted in the second power wire and has a gate connected to a first transistor terminal of the third transistor;
- an inter-element wire which connects a second transistor terminal of the first transistor, a second transistor terminal of the second transistor and a second transistor terminal of the third transistor; and
- a capacitor which has one end connected to the inter-element wire and an other end receiving an input of a second AC signal whose phase is inverted from a phase of the first AC signal.

12. The semiconductor device according to claim 11, further comprising a third capacitor that is connected between the first power wire and the second power wire.

13. The semiconductor device according to claim 11, further comprising:
- a plurality of rectifier circuits that is formed by connecting in cascade a first output terminal provided on the first power wire and a second output terminal provided on the second power wire; and
- a smoothing capacitor that is connected between the first power wire of the rectifier circuit arranged at a first stage and the second power wire of the rectifier circuit arranged at a final stage.

14. The semiconductor device according to claim 11, further comprising:
- a plurality of rectifier circuits that includes loads connected with a first output terminal provided on the first power wire through a common wire, respectively; and
- a smoothing capacitor that is connected between the common wire and a ground wire.

15. The semiconductor device according to claim 11, further comprising a power circuit that is connected between the first power wire and the second power wire, and that generates a second power voltage by performing at least one of stepping up and stepping down of a first power voltage transmitted through the second power wire.

* * * * *